(12) United States Patent
Oh et al.

(10) Patent No.: US 10,847,697 B2
(45) Date of Patent: Nov. 24, 2020

(54) SIDE VIEW LED PACKAGE AND SIDE VIEW LED MODULE

(71) Applicant: LUMENS CO., LTD., Yongin-si (KR)

(72) Inventors: Seunghyun Oh, Yongin-si (KR); Hyogu Jeon, Yongin-si (KR); Chigyun Song, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 30 days.

(21) Appl. No.: 16/287,310

(22) Filed: Feb. 27, 2019

(65) Prior Publication Data
US 2019/0305201 A1 Oct. 3, 2019

(30) Foreign Application Priority Data

Mar. 29, 2018 (KR) .......... 10-2018-0036404
Dec. 21, 2018 (KR) .......... 10-2018-0166909

(51) Int. Cl.
*H01L 33/62* (2010.01)
*H01L 33/60* (2010.01)
*H01L 33/50* (2010.01)
*H01L 25/075* (2006.01)

(52) U.S. Cl.
CPC .......... *H01L 33/62* (2013.01); *H01L 25/0753* (2013.01); *H01L 33/505* (2013.01); *H01L 33/60* (2013.01)

(58) Field of Classification Search
CPC ....... H01L 33/62; H01L 33/60; H01L 33/505; H01L 33/507; H01L 33/54; H01L 24/97
See application file for complete search history.

(56) References Cited

U.S. PATENT DOCUMENTS

2015/0340574 A1* 11/2015 Tamaki ................ H01L 33/507
257/98
2018/0080641 A1 3/2018 Tanaka et al.
2018/0159004 A1* 6/2018 Lai ....................... G02B 6/0073

FOREIGN PATENT DOCUMENTS

| JP | 2013-041865 A | 2/2013 |
| JP | 2014-033237 A | 2/2014 |
| JP | 2015-220446 A | 12/2015 |
| JP | 2017-108111 A | 6/2017 |

* cited by examiner

*Primary Examiner* — Julia Slutsker
(74) *Attorney, Agent, or Firm* — Mei & Mark LLP

(57) ABSTRACT

A side view LED module is disclosed. The side view LED module includes: a mount substrate; a side view LED package including an LED unit and a body including a first side to which the LED unit is bonded, a second side parallel to the first side, a third side orthogonal to the first and second sides and facing the mount substrate, and terminals formed on the first, second, and third sides; and solder joints through which the terminals are electrically connected to the mount substrate. Each of the terminals includes an opening formed at the second side and a concave electrode extending from the opening toward the first side and recessed relative to the third side. Each of the solders fills only a portion of an inner space of the corresponding concave electrode and includes a base portion formed on the third side and inner fillets extending upward along the inner wall surfaces of the concave electrode from the base portion.

27 Claims, 20 Drawing Sheets

(a)

(b)

SIDE VIEW LED PACKAGE AND SIDE VIEW LED MODULE

BACKGROUND OF THE INVENTION

1. Field of the Invention

The present invention relates to a side view LED package and a side view LED module.

2. Description of the Related Art

Side view LED modules have been widely used in display backlight and other lighting applications. Such a side view LED module includes a mount substrate and side view LED packages mounted on the mount substrate. Each of the side view LED packages is mounted on the mount substrate by surface mount technology (SMT) using solders. The side view LED package usually includes terminals. The terminals include inner terminals connected to electrode pads of LED chips inside the package body and outer terminals connected to electrode patterns formed on the mount substrate outside the package body.

In the conventional side view LED module, the outer terminals extend outward from the package bodies. However, the outer terminals and the solders bonding the outer terminals to the electrode patterns formed on the mount substrate make it difficult to reduce the distances between the side view LED packages arrayed on the mount substrate. An attempt to reduce the distances between the side view LED packages arrayed on the mount substrate is to design the side view LED packages such that the outer terminals underly the package bodies. In this case, however, it is difficult for the solders to form fillets covering all intersections between the outer terminals and the electrode patterns.

Chip scale package (CSP) type LED units have been developed recently. CSP type LED units have a structure in which the ratio of the horizontal cross-sectional area of LED chips to that of packages is large and electrode pads of the LED chips are exposed through the bottom of a reflector. CSP type LED units have advantages in that the benefits of flip-chip technology in terms of chip size and performance are utilized, a simple assembly is possible based on surface mount technology (SMT), and short leads such as solder balls result in low inductance and improved electrical performance.

In the conventional CSP type LED units, the side surfaces of wavelength converting layers including a phosphor are vertical. Due to this structure, the inner wall surfaces of the reflectors surrounding the side surfaces of the phosphor are limited to 90° and thus an improvement in luminance by the reflectors cannot be expected at all. The CSP type LED units are applied to top view type LED packages in which the mounting direction is opposite to the light emission direction but fail to apply to side view LED packages in which the mounting direction and the light emission direction crosses each other at substantially a right angle. This is attributed to the structure of the CSP type LED units in which the emission direction of light from LED chips is opposite to the exposure direction of the electrode pads of the LED chips.

SUMMARY OF THE INVENTION

One object of the present invention is to provide a side view LED package using a CSP type LED unit in which the emission direction of light from an LED chip is opposite to the exposure direction of electrode pads of the LED chip.

A further object of the present invention is to provide a side view LED package in which the side surfaces of a wavelength converting layer are inclined by oblique cutting and the inner wall surfaces of a reflector surrounding the side surfaces of the wavelength converting layer are also inclined at a desired angle.

Another object of the present invention is to provide a side view LED module in which exposed areas of solders bonding a side view LED package to a mount substrate are minimized, the bonding strength between the side view LED package and the mount substrate through the solders is improved, and problems (e.g., tilting) encountered in conventional side view LED packages are avoided.

A side view LED module according to one aspect of the present invention includes: a mount substrate; a side view LED package including an LED unit and a body including a first side to which the LED unit is bonded, a second side parallel to the first side, a third side orthogonal to the first and second sides and facing the mount substrate, and terminals formed on the first, second, and third sides; and solder joints through which the terminals are electrically connected to the mount substrate, wherein each of the terminals includes an opening formed at the second side and a concave electrode extending from the opening toward the first side and recessed relative to the third side, and wherein each of the solders fills only a portion of an inner space of the corresponding concave electrode and includes a base portion formed on the third side and inner fillets extending upward along the inner wall surfaces of the concave electrode from the base portion.

According to one embodiment, each of the terminals includes a first electrode pattern formed on the first side, a second electrode pattern formed on the second side and connected to the corresponding concave electrode around the corresponding opening, and a via connecting the first electrode pattern to the second electrode pattern.

According to one embodiment, the inner wall surfaces of each of the concave electrodes include a concave inner wall surface extending a distance from the corresponding opening and a vertical inner wall surface formed at one end of the concave inner wall surface and parallel to the opening.

According to one embodiment, the inner fillets include a first inner fillet in contact with the vertical inner wall surface and second inner fillets in contact with both sides of the concave inner wall surface.

According to one embodiment, each of the solder joints further includes an outer fillet completely closing the corresponding opening and in contact with the corresponding second electrode pattern around the opening.

According to one embodiment, the outer fillet includes a stepped portion supporting the concave inner wall surface of the corresponding concave electrode.

According to one embodiment, the second electrode pattern includes a solder bonding area around the corresponding opening and a via connection area protruding laterally from the outer line of the solder bonding area.

According to one embodiment, the concave inner wall surface has a hemispherical or arched shape in cross section.

According to one embodiment, the LED unit includes an LED chip having an electrode side connected with the first electrode patterns and a light emitting side opposite to the electrode side, a wavelength converting sheet arranged on the light emitting side of the LED chip, and a reflector disposed surrounding the side surfaces of the LED chip and the side surfaces of the wavelength converting sheet.

According to one embodiment, the wavelength converting sheet includes inclined side surfaces formed by oblique cutting.

According to one embodiment, the reflector includes a side lying in the same plane as the third side.

According to one embodiment, the LED unit includes: a first LED chip and a second LED chip, each of which has an electrode side on which first and second conductive electrodes are connected to the first electrode patterns and a light emitting side opposite to the electrode side; a first wavelength converting sheet and a second wavelength converting sheet arranged on the light emitting side of the first LED chip and the light emitting side of the second LED chip, respectively; and a reflector disposed surrounding the side surfaces of the first LED chip and the first wavelength converting sheet and the side surfaces of the second LED chip and the second wavelength converting sheet.

According to one embodiment, the first electrode patterns include a $1\text{-}1^{st}$ electrode pattern, a $1\text{-}2^{nd}$ electrode pattern, and a $1\text{-}3^{rd}$ electrode pattern; the second electrode patterns include a $2\text{-}1^{st}$ electrode pattern, a $2\text{-}2^{nd}$ electrode pattern, and a $2\text{-}3^{rd}$ electrode pattern; and the vias include a first via connecting the $1\text{-}1^{st}$ electrode pattern to the $2\text{-}1^{st}$ electrode pattern, one or more second vias connecting the $1\text{-}2^{nd}$ electrode pattern to the $2\text{-}2^{nd}$ electrode pattern, and a third via connecting the $1\text{-}3^{rd}$ electrode pattern to the $2\text{-}3^{rd}$ electrode pattern.

According to one embodiment, the first conductive electrode of the first LED chip is connected to the $1\text{-}1^{st}$ electrode pattern; the second conductive electrode of the second LED chip is connected to the $1\text{-}3^{rd}$ electrode pattern; and the second conductive electrode of the first LED chip and the first conductive electrode of the second LED chip are connected to the $1\text{-}2^{nd}$ electrode pattern.

According to one embodiment, the first conductive electrode of the first LED chip is connected to the $1\text{-}1^{st}$ electrode pattern; the first conductive electrode of the second LED chip is connected to the $1\text{-}3^{rd}$ electrode pattern; and the second conductive electrode of the first LED chip and the second conductive electrode of the second LED chip are connected to the $1\text{-}2^{nd}$ electrode pattern.

According to one embodiment, the concave electrodes include a first concave electrode connected to the $2\text{-}1^{st}$ electrode pattern and a second concave electrode connected to the $2\text{-}3^{rd}$ electrode pattern.

A method for manufacturing a side view LED module according to a further aspect of the present invention includes: preparing a mount substrate; preparing a side view LED package including a body and an LED unit coupled with the body and emitting light in a direction opposite to the coupling direction of the body; and mounting the side view LED package on the mount substrate such that terminals of the side view LED package are fixed to the mount substrate by solder joints, wherein the preparation of a side view LED package includes constructing an LED unit and constructing a body including a first side to which the LED unit is bonded, a second side parallel to the first side, a third side orthogonal to the first and second sides and facing the mount substrate, and terminals including concave electrodes extending from openings formed at the second side toward the first side and recessed relative to the third side, and wherein when the side view LED package is mounted, each of the solder joints is formed to include a base portion and inner fillets extending upward along the inner wall surfaces of the corresponding concave electrode from the base portion.

According to one embodiment, the terminals include first electrode patterns formed on the first side of the body, second electrode patterns formed on the second side of the body and connected to the concave electrodes around the corresponding openings, and vias connecting the first electrode patterns to the second electrode patterns.

According to one embodiment, the construction of the body includes: preparing a body base including a top surface and a bottom surface; forming blind holes extending a depth from the bottom surface of the body base and through-holes penetrating the body base; forming metal layers covering the inner surfaces of the blind holes, the inner surfaces of the through-holes, the top surface, and the bottom surface; patterning the metal layer formed on the top surface and the metal layer formed on the bottom surface; and singulating the body base, wherein when the body base is singulated, the metal layer formed in each of the blind holes is cut into two concave electrodes.

According to one embodiment, the inner wall surface of each of the concave electrodes includes a concave inner wall surface extending a distance from the corresponding opening and a vertical inner wall surface formed at one end of the concave inner wall surface; and when the side view LED package is mounted, each of the solder joints is formed to include a first inner fillet in contact with the vertical inner wall surface, second inner fillets in contact with both sides of the concave inner wall surface, and an outer fillet completely closing the corresponding opening and in contact with the corresponding second electrode pattern around the opening.

According to one embodiment, the construction of the LED unit includes: producing wavelength converting sheets, each of which includes inclined side surfaces formed by oblique cutting; preparing LED chips; bonding each of the wavelength converting sheets to one side of the corresponding LED chip; arraying the LED chips bonded with the wavelength converting sheets and disposing a reflective member so as to surround the side surfaces of the wavelength converting sheets and the side surfaces of the LED chips; and singulating the reflective member.

A method for fabricating a side view LED package according to another aspect of the present invention includes: preparing a body including first electrode patterns formed on a first side and second electrode patterns formed on a second side opposite to the first side; and mounting an LED unit on the first electrode patterns, wherein vias are formed at edges of the body to connect the first electrode patterns to the second electrode patterns and wherein the first electrode patterns, the second electrode patterns, and the vias form angled C-shaped soldering patterns.

According to one embodiment, when the body is prepared, the first electrode patterns are formed to have the same shapes as the second electrode patterns.

According to one embodiment, the body includes a third side orthogonal to the first and second sides and facing a mount substrate when mounted on the mount substrate and the vias formed at edges of the body are exposed toward the mount substrate at the third edge.

According to one embodiment, the vias are formed along the edges connecting the first side to the second side.

According to one embodiment, when the body is prepared, each of the first and second electrode patterns has an L shape with a horizontal portion and a vertical portion, and each of the angled C-shaped soldering patterns consists of the via, the vertical portion of the first electrode pattern, and the vertical portion of the second electrode pattern.

According to one embodiment, the vias are formed by filling a conductive material in via holes formed in a substrate and cutting the substrate together with the conductive material.

According to one embodiment, the method includes: producing wavelength converting sheets, each of which has inclined surfaces formed by oblique cutting; bonding the wavelength converting sheets to corresponding LED chips; arraying the LED chips bonded with the wavelength converting sheets and disposing a reflective member so as to surround the side surfaces of the wavelength converting sheets and the side surfaces of the LED chips; and singulating the reflective member to prepare the LED unit.

According to one embodiment, each of the wavelength converting sheets is prepared by cutting such that the area of a side of the wavelength converting sheet in contact with the corresponding LED chip is equal to or larger than the contact area between the LED chip and the wavelength converting sheet.

According to one embodiment, each of the wavelength converting sheets is produced such that its cross-sectional area increases gradually from a side in contact with the corresponding LED chip to the opposite side.

A side view LED package according to another aspect of the present invention includes: a body having first electrode patterns formed on a first side and second electrode patterns formed on a second side parallel to the first side; and an LED unit mounted on the first electrode patterns of the body, wherein the body includes vias formed at edges thereof to connect the first electrode patterns to the second electrode patterns and wherein the body includes angled C-shaped soldering patterns formed by the first electrode patterns, the second electrode patterns, and the vias.

According to one embodiment, the vias are formed by filling a conductive material in via holes and are exposed to the outside at edges of the body.

According to one embodiment, the body includes a third side orthogonal to the first and second sides and the vias are formed at edges of the third side to connect the first side to the second side.

According to one embodiment, each of the first and second electrode patterns has an L shape with a horizontal portion and a vertical portion.

According to one embodiment, each of the angled C-shaped soldering patterns is formed by the via, the vertical portion of the first electrode pattern, and the vertical portion of the second electrode pattern.

According to one embodiment, the body includes a third side orthogonal to the first and second sides and the angled C-shaped soldering patterns are formed only on the third side of the body.

According to one embodiment, the side view LED package is mounted on a mount substrate such that the angled C-shaped soldering patterns face the mount substrate.

According to one embodiment, the LED unit may be of a chip scale package (CSP) type.

According to one embodiment, the LED unit includes an LED chip, an inwardly-obliquely cut wavelength converting sheet attached to the LED chip, and a reflector structure surrounding the side surfaces of the LED chip and the side surfaces of the wavelength converting sheet.

According to one embodiment, the area of a side of the wavelength converting sheet in contact with the LED chip is equal to or larger than the contact area between the LED chip and the wavelength converting sheet.

According to one embodiment, the cross-sectional area of the wavelength converting sheet increases gradually from a side in contact with the LED chip to the opposite side.

In the CSP type LED unit of the side view LED package according to the present invention, the emission direction of light from the LED chip is opposite to the exposure direction of the electrode pads of the LED chip.

In the side view LED package of the present invention, the side surfaces of the wavelength converting layer are inclined by oblique cutting and the inner wall surfaces of the reflector surrounding the side surfaces of the wavelength converting layer are also inclined at a desired angle.

In the side view LED module of the present invention, exposed areas of the solders bonding the side view LED package to the mount substrate are minimized, the bonding strength between the side view LED package and the mount substrate through the solders is improved, and problems (e.g., tilting) encountered in conventional side view LED packages are avoided.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings.

First Embodiment

Figure 1:
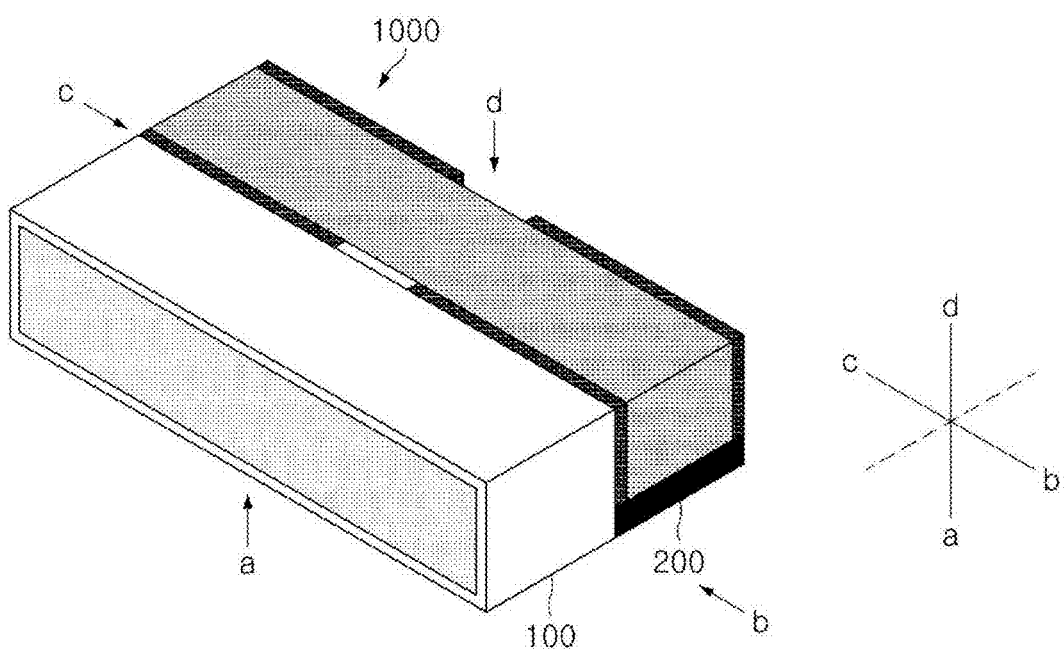
FIG. 1 is a perspective view illustrating a side view LED package according to a first embodiment of the present invention.
Figure 2:
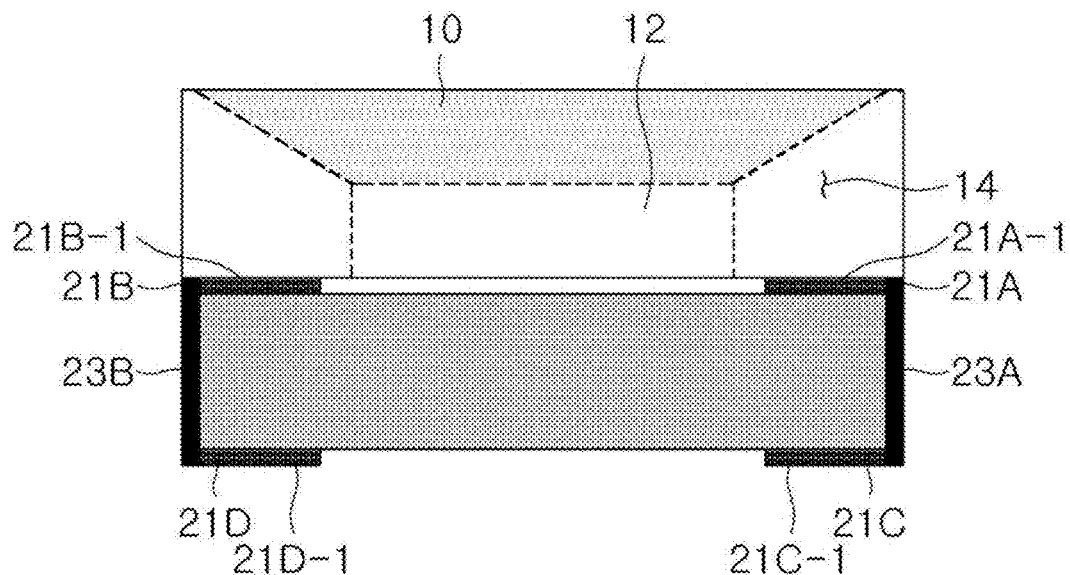
FIG. 2 illustrates the side view LED package of FIG. 1 when viewed in the direction of the arrow a. Here, the internal structure of the side view LED package is shown by hidden lines.

FIG. 1 is a perspective view illustrating a side view LED package according to a first embodiment of the present invention and FIG. 2 illustrates the side view LED package of FIG. 1 when viewed in the direction of the arrow a, that is, when viewed from the bottom.

Referring to FIGS. 1 and 2, the side view LED package 1000 includes an LED unit 100 and a body 200 mounted with the LED unit 100. The body 200 functions as a substrate on which the LED unit 100 is mounted. The LED unit 100 has a chip scale package (CSP) structure including a reflector, which will be described below. The LED unit 100 has a top view type CSP structure but the LED package 1000 including the body 200 and the LED unit 100 may be of a side view type because the body 200 coupled with the LED unit 100 is mounted on a mount substrate 300 in a direction orthogonal to the coupling direction of the body 200.

The LED unit 100 as an element of the side view LED package 1000 includes a wavelength converting sheet 10, an LED chip 12, and a reflector 14. The wavelength converting sheet 10 is attached to one side (i.e. a light emitting side) of the LED chip 12 and both sides of the wavelength converting sheet 10 are inclined. For example, the wavelength converting sheet 10 may include a phosphor. Due to these inclined sides, the width or cross-sectional area of the wavelength converting sheet 10 increases from the side of the wavelength converting sheet 10 attached with the LED chip 12 to the opposite side. The reflector 14 covers the side surfaces of the LED chip 12 and the side surfaces of the wavelength converting sheet 10. The LED chip 12 includes an electrode side on which first and second conductive electrode pads are disposed and a light emitting side opposite to the electrode side. The electrode side is bonded to a first side of the body 200.

The body 200 as another element of the wavelength converting sheet 10 includes a first side to which the LED unit is bonded, a second side parallel to the first side, and a third side orthogonal to the first and second sides. The third side of the body 200 faces the mount substrate 300 (see FIG. 11) when the side view LED package 1000 is mounted on the mount substrate 300.

The body 200 includes first electrode patterns formed on the first side and second electrode patterns formed on the second side. The second electrode patterns have the same or similar shape as the first electrode patterns. The first electrode patterns include a $1\text{-}1^{st}$ electrode pattern 21A and a $1\text{-}2^{nd}$ electrode pattern 21B. The second electrode patterns include a $2\text{-}1^{st}$ electrode pattern 21C and a $2\text{-}2^{nd}$ electrode pattern 21D. The body 200 includes a via 23A connecting the first electrode pattern 21A to the second electrode pattern 21C and a via 23B connecting the first electrode pattern 21B to the second electrode pattern 21D. The vias 23A and 23B are formed at edges of the body 200 and are exposed to the outside.

The side view LED package 1000 is mounted on a PCB as the mount substrate by SMT such that the side of the side view LED package 1000 visible from FIG. 2 (i.e. the third side of the body 200) faces the PCB.

Figure 3:
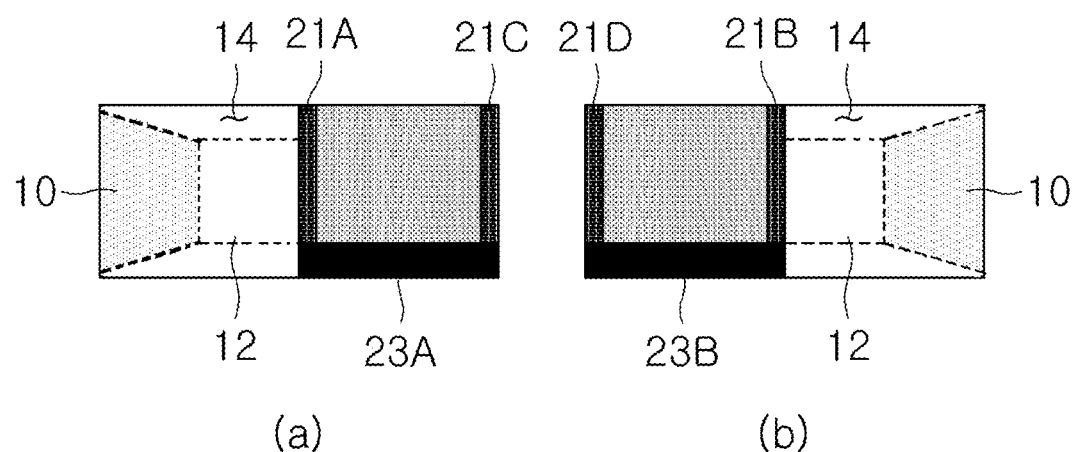
FIG. 3 illustrates the side view LED package of FIG. 1 when viewed from the directions of the arrows b (a) and c (b). Here, the internal structure of the side view LED package is shown by hidden lines.

A first terminal and a second terminal are formed at both sides of the body 200, respectively. The first terminal has an angled C shape because it consists of the $1\text{-}1^{st}$ electrode pattern 21A, the $2\text{-}1^{st}$ electrode pattern 21C, and the first via 23A connecting the two electrode patterns. The second terminal has an angled C shape because it consists of the $1\text{-}2^{nd}$ electrode pattern 21B, the $2\text{-}2^{nd}$ electrode pattern 21D, and the second via 23B connecting the two electrode patterns. Each of the angled C-shaped terminals is formed by the side surface of the first electrode pattern 21A or 21B, the side surface of the second electrode pattern 21C or 21D, and the via 23A or 23B formed at one edge of the body 200 to connect the first electrode pattern to the second electrode pattern. The surfaces of the vias are also exposed to the outside and are in contact with solders, contributing to an increase in soldering area. (a) and (b) of FIG. 3 illustrate the side view LED package of FIG. 1 when viewed in the directions of the arrows b and c, respectively. Referring to (a) and (b) of FIG. 3, patterns of the angled C-shaped terminals at the third side that can be soldered while facing the mount substrate are visible only when the side view LED package 1000 of FIG. 1 is viewed in the direction of the arrow a.

Figure 4:
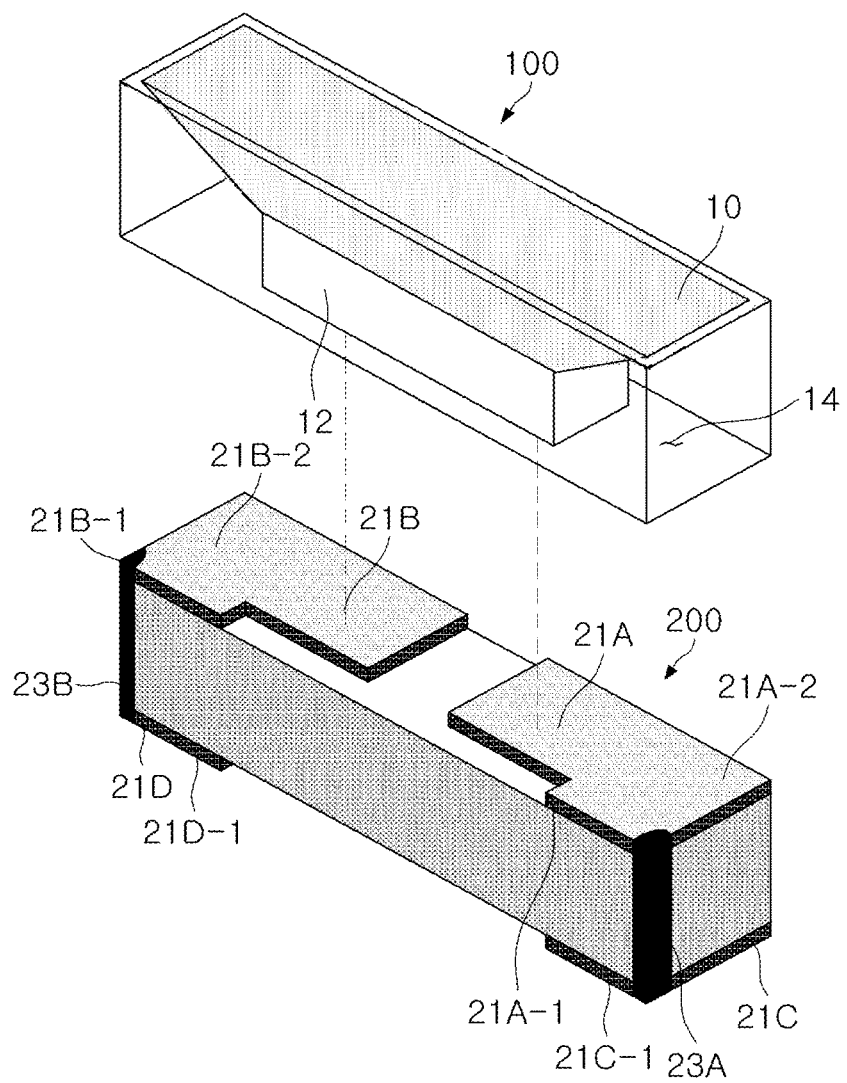
FIG. 4 illustrates a state of the side view LED package of FIGS. 1 to 3 before the LED unit is coupled with the body.

FIG. 4 illustrates a state of the side view LED package 1000 before the CSP type LED unit 100 is coupled with the body 200. Referring to FIG. 4, the LED chip 12 of the CSP type LED unit 100 can be bonded to the primary surfaces (i.e. the horizontal portions 21A-2 and 21B-2) of the first electrode patterns 21A and 21B formed on the first side of the body 200. Although not specifically illustrated, the LED chip 12 has electrode pads bonded to the first electrode patterns 21A and 21B on a side facing the first side of the body 200.

Figure 5:
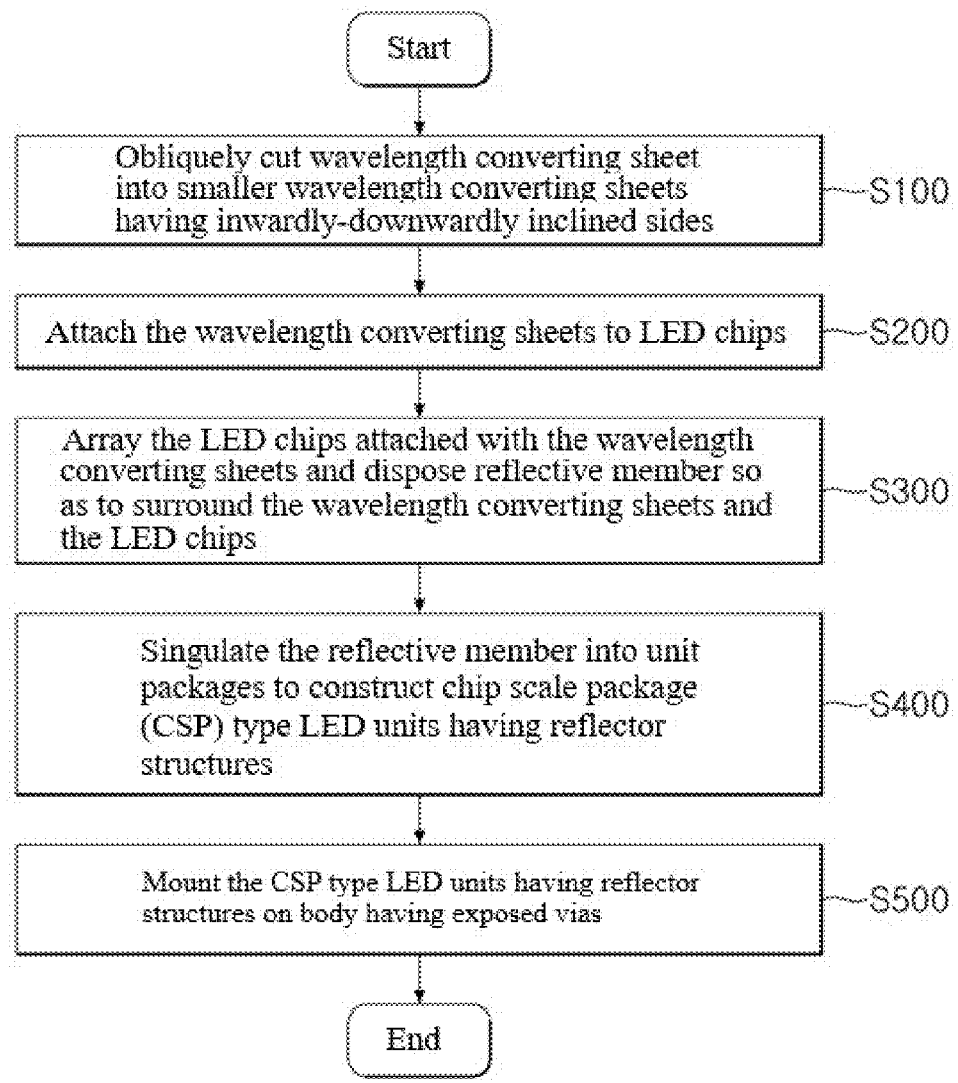
FIG. 5 is a flowchart illustrating a method for fabricating a side view LED package according to a first embodiment of the present invention.
Figure 6:
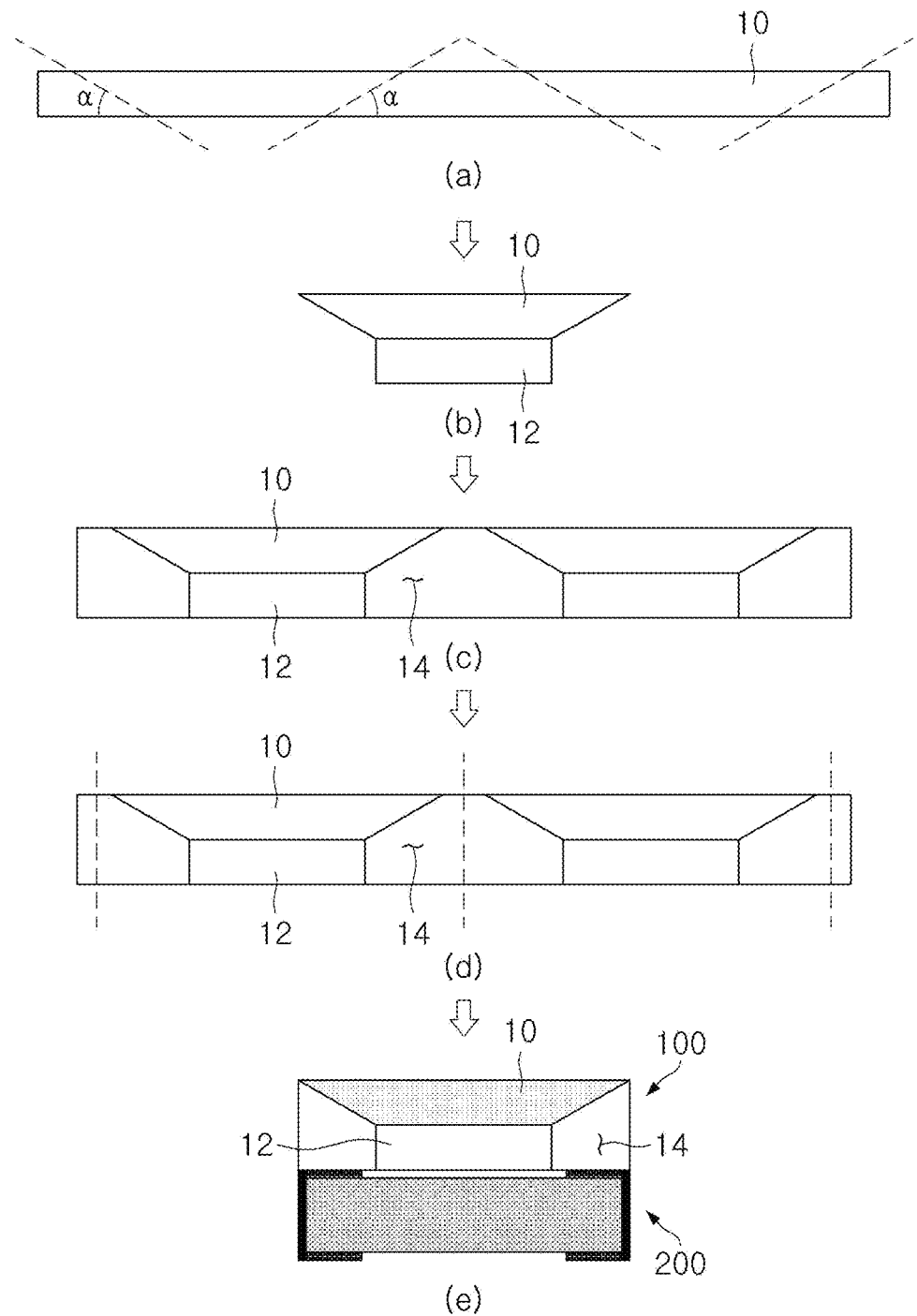
FIG. 6 schematically illustrates a method for fabricating a side view LED package according to a first embodiment of the present invention.

FIG. 5 is a flowchart illustrating a method for fabricating the side view LED package 1000 and FIG. 6 schematically illustrates the method. Referring to FIGS. 5 and 6, the method includes: obliquely cutting a wavelength converting sheet including a phosphor into smaller wavelength converting sheets 10 having inwardly-downwardly inclined sides (S100); attaching the wavelength converting sheets 10 to light emitting sides of corresponding LED chips 12 (S200); arraying the LED chips 12 attached with the wavelength converting sheets 10 on a plane and disposing a reflective member 14 so as to surround the side surfaces of the wavelength converting sheets 10 and the side surfaces of the LED chips 12 (S300); singulating the reflective member 14 into unit packages to construct chip scale package (CSP) type LED units 100, each of which has a reflector structure (S400); and mounting each of the CSP type LED units 100 having a reflector structure on a body 200 having exposed vias 23A and 23B (S500). Reference numeral 14 is used to designate either the reflective member or the reflector obtained by cutting the reflective member.

In S100, a wavelength converting sheet 10 is obliquely cut into smaller wavelength converting sheets having inwardly-downwardly inclined sides ((a) of FIG. 6).

In this embodiment, CSP type LED units 100 are constructed by obliquely cutting a wavelength converting sheet into smaller wavelength converting sheets 10 having inwardly-downwardly inclined sides and attaching LED chips 12 to the corresponding wavelength converting sheets 10.

Figure 7:
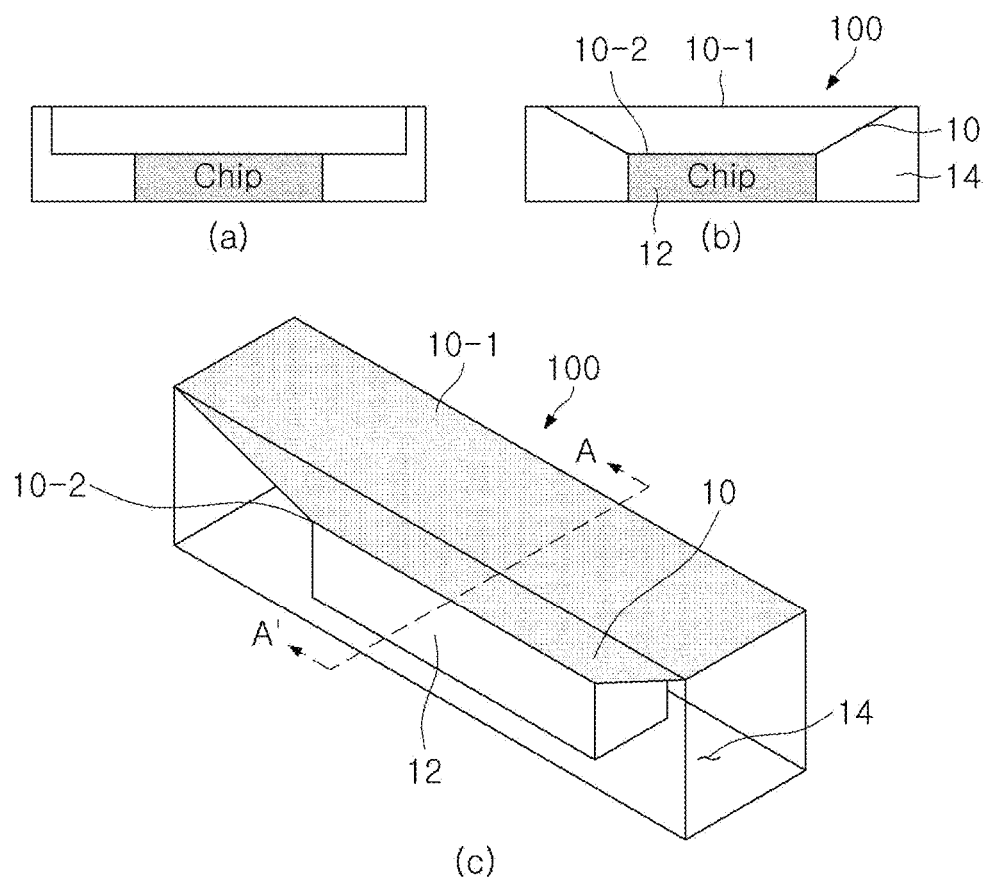
FIG. 7 illustrates (a) a comparative CSP type LED unit and (b) and (c) a CSP type LED unit of a side view LED package according to a first embodiment of the present invention.

Referring to FIG. 7, the area of the lower side 10-2 of each of the wavelength converting sheets 10 may be equal to or larger than the area of the upper side of the corresponding LED chip 12 and the cross-sectional area of the wavelength converting sheet 10 increases gradually from the lower side 10-2 to the upper side 10-1.

Accordingly, the wavelength converting sheet 10 has a shape in which the inwardly-downwardly inclined sides face each other.

Referring again to FIG. 6, each of the inclined sides of the wavelength converting sheet 10 preferably has an angle α of 30° to 60° relative to the horizontal. However, the inclination angle may vary depending on the size of the LED chip 12 or the size of the CSP type LED unit 100.

Each of the wavelength converting sheets 10 includes a wavelength converting material. The wavelength converting material may include a material converting the wavelength of light from the LED chip 12. For example, the wavelength converting material may be a phosphor that has the ability to convert light from the LED chip into white light. The wavelength converting material may include a combination of a green phosphor and a red phosphor (G+R) or a combination of a yellow phosphor and a red phosphor (Y+R). The green (or yellow) phosphor transmits a portion of blue light as a source without conversion and converts another portion of the blue light into green (or yellow) light. The red phosphor converts another portion of the blue light into red light.

Examples of such phosphors include yttrium.aluminum garnet (YAG) based phosphors activated with yellow light emitting cerium, ruthenium.aluminum.garnet (LAG) based phosphors activated with green light emitting cerium, nitrogen-containing calcium aluminosilicate ($CaO$—$Al_2O_3$—$SiO_2$) based phosphors activated with green or red light emitting europium and/or chromium, silicate (($Sr, Ba)_2SiO_4$) based phosphors activated with red light emitting europium, green light emitting 13 SiAlON phosphors represented by $(Si, Al)_6(O,N)_8$:Eu, sulfide based phosphors represented by $SrGa_2S_4$:Eu, nitride based phosphors, such as red light emitting CaSN based phosphors represented by $CaAlSiN_3$:Eu and SCASN based phosphors represented by (Sr, Ca)$AlSiN_3$:Eu, red light emitting fluoride based phosphors represented by ($K_2SiF_6$:Mn), red light emitting sulfide based phosphors, and red light emitting germanate (MGF) based phosphors represented by $3.5MgO.0.5MgF_2.GeO_2$:Mn.

These phosphors may be used alone or in admixture with quantum dots. The oxide, nitride, and silicate based phosphors may be used as a mixture thereof.

In S200, the wavelength converting sheets 10 ((b) of FIG. 6) are attached to corresponding LED chips 12. The LED chips 12 may be a flip-chip type. As will be described in more detail, CSP type LED units 100 including the LED chips 12 do not require reflective cups including leads, bonding wires, and others, have a simple, compact, small structure in which n-type and p-type electrode pads of the LED chips 12 are exposed to the outside, and can be constructed in a very economical manner without any troublesome process such as wire bonding.

Each of the LED chips 12 may be a flip-chip type including electrode pads (not illustrated) disposed on a side opposite to the light emission side. The light emission side is substantially parallel and opposite to the side on which the electrode pads are disposed.

In S300, the LED chips 12 attached with the wavelength converting sheets 10 are arrayed on a plane and a reflective member 14 is disposed so as to surround the side surfaces of the wavelength converting sheets 10 and the side surfaces of the LED chips 12 ((c) of FIG. 6).

Preferably, the LED chips 12 attached with the wavelength converting sheets 10 are arrayed on a separate sheet and a reflective member 14 is then disposed. In this embodiment, the reflective member 14 may be a white wall formed using a resin mixed with a particulate white reflective material. The reflective member 14 is an element that reflects light output from the LED chips 12 toward the output sides. The reflective member 14 functions to reflect light irradiated from the LED chips 12 toward an output unit. The reflective member 14 may be disposed in contact with both the wavelength converting sheets 10 and the LED chips 12.

In one embodiment, the reflective member 14 may be made of a molding material selected from epoxy resin compositions, silicone resin compositions, modified epoxy resin compositions, modified silicone resin compositions, polyimide resin compositions, modified polyimide resin compositions, polyphthalamide (PPA), polycarbonate resins, polyphenylene sulfide (PPS), liquid crystal polymers (LCPs), ABS resins, phenolic resins, acrylic resins, PBT resins, and combinations thereof. These resins may contain one or more light reflective materials. Examples of such light reflective materials include titanium oxide, silicon dioxide, titanium dioxide, zirconium dioxide, potassium titanate, alumina, aluminum nitride, boron nitride, mullite, chromium, white components, and metallic components. The reflective member 14 made of the molding material may be selected from EMCs including reflective materials, white silicone including reflective materials, photoimageable solder resists (PSRs), and combinations thereof.

The reflective member 14 surrounds the wavelength converting sheets 10 and the LED chips 12. The reflective member 14 can adjust the paths of light from the LED chips 12 such that the light propagates upward through the wavelength converting sheets 10.

In S400, the reflective member 14 is singulated into unit packages to construct chip scale package (CSP) type LED units 100, each of which has a reflector structure ((d) of FIG. 6). As a result of this singulation, a plurality of LED units are constructed. The reflective member 14 may be singulated into unit packages by any suitable process, such as blade cutting, laser cutting or trim cutting. The chip scale package (CSP) type LED units 100 have individual reflector structures. The sheet used to array the LED chips 12 attached with the wavelength converting sheets 10 in S300 is removed during the singulation.

In S500, each of the CSP type LED units 100 having a reflector structure is mounted on a body 200 having exposed vias 23A and 23B ((e) of FIG. 6).

In S500, each of the LED units 100 constructed through S100 to S400 is mounted on a body 200 such that the electrode pads of the LED chip 12 are connected to upper electrode patterns 21A and 21B of the body 200.

The body 200 may be mounted on a mount substrate such that a side orthogonal to the side on which the body 200 is coupled with the LED unit 100 faces the mount substrate such as a PCB in the subsequent step. To this end, the vias 23A and 23B are exposed toward the mount substrate at edges of a side of the body 200 facing the mount substrate. The structure of the body 200 and a method for constructing the body 200 will be described in detail with reference to FIGS. 8 to 10.

In FIG. 7, (a) illustrates a comparative CSP type LED unit and (b) and (c) illustrate a CSP LED unit 100 having a reflector structure according to the present invention.

According to this embodiment, the LED unit 100 includes an LED chip 12, an inwardly obliquely cut wavelength converting sheet 10 attached to the LED chip 12, and a reflector 14 surrounding the LED chip 12 and the wavelength converting sheet 10.

As illustrated in (a) of FIG. 7, the comparative LED unit includes a wavelength converting sheet whose side surfaces are vertical. Due to this structure, the angles of the inner side surfaces of the reflector in contact with the side surfaces of the wavelength converting sheet are limited to 90°. Thus, an increase in luminance by the reflector cannot be expected at all.

In contrast, in the CSP type LED unit 100 illustrated in (b) of FIG. 7, the inner wall surfaces of the reflective member 14 in contact with the inclined side surfaces of the wavelength converting sheet 10 are inclined at an angle larger than 90°. This inclination contributes to high luminance of the LED unit.

The LED unit 100 can be applied to ultra slim side view LED packages with a thickness of 0.3 mm or less.

As mentioned earlier, the area of the lower side 10-2 of the wavelength converting sheet 10 of the LED unit 100 may be equal to or larger than the area of the upper side of the LED chip 12 and the cross-sectional area of the wavelength converting sheet 10 increases gradually from the lower side 10-2 to the upper side 10-1.

Accordingly, the wavelength converting sheet 10 are inwardly-downwardly inclined at both opposite sides.

Here, the inclination angle of each of the inclined sides of the wavelength converting sheet 10 is preferably from 22° to 25° relative to the horizontal but may vary depending on the size of the LED chip 12 or the size of the CSP type LED unit 100.

Figure 8:
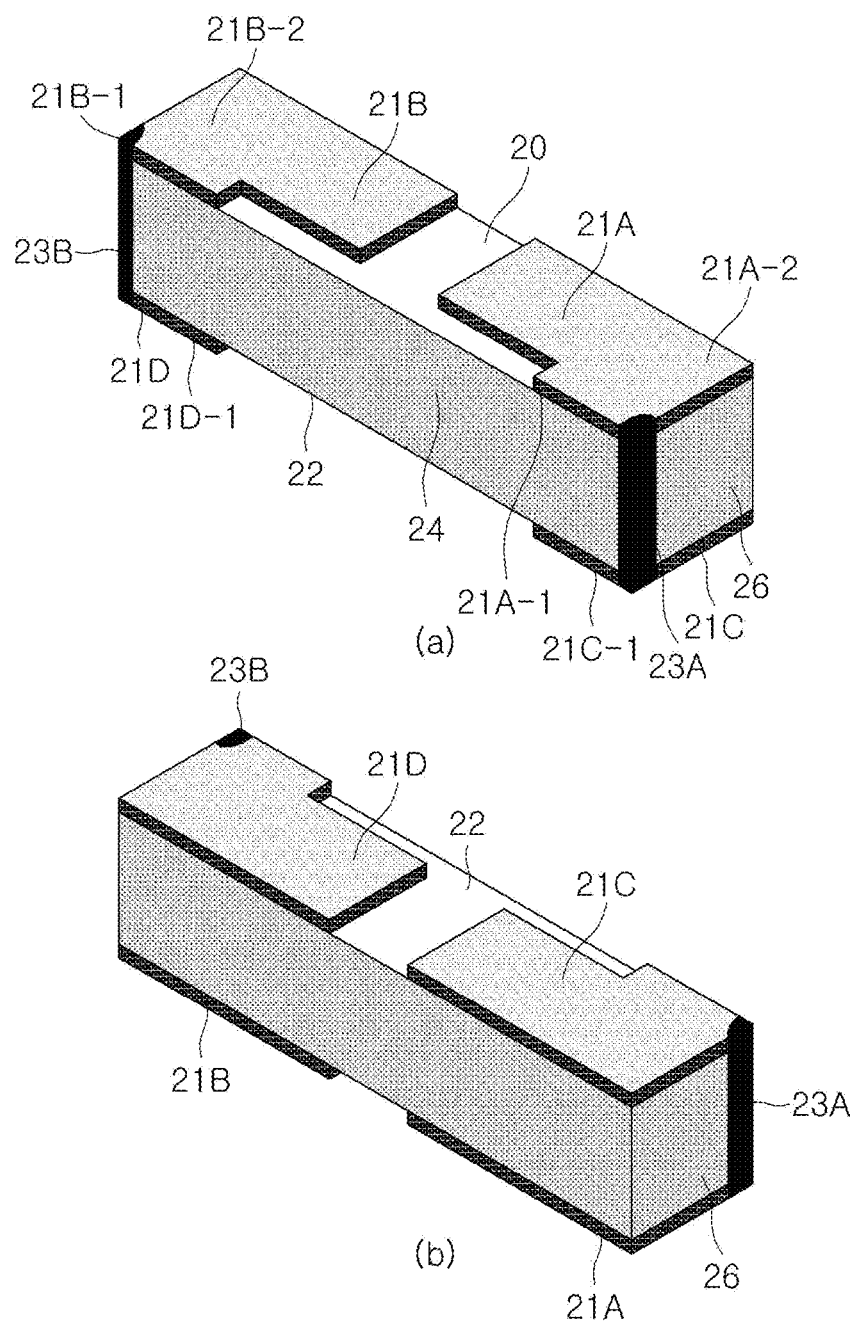
FIG. 8 illustrates (a) a perspective view and (b) a rear perspective view of a body coupled with an LED unit in a side view LED package according to a first embodiment of the present invention.
Figure 9:
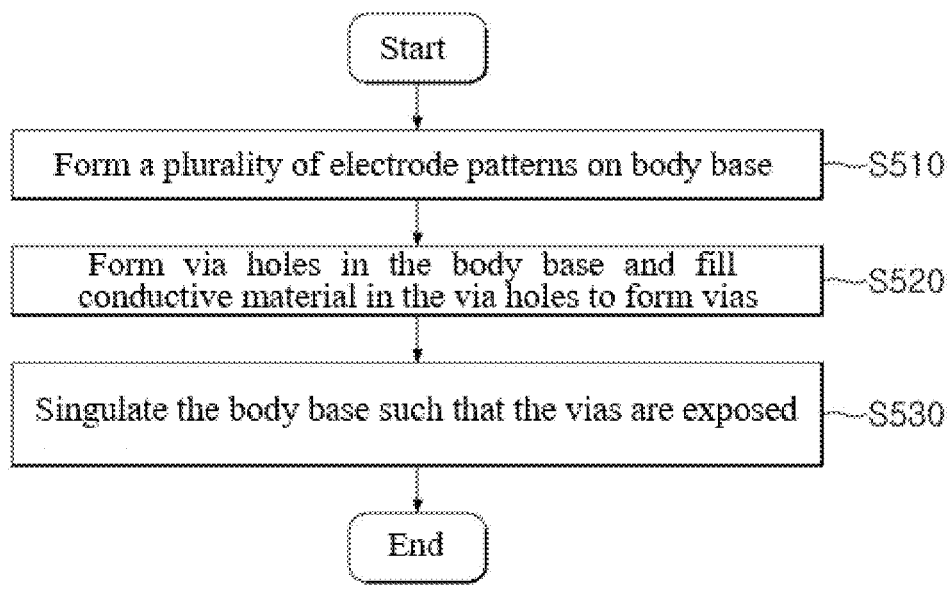
FIG. 9 is a flowchart illustrating a method for constructing a body of a side view LED package according to a first embodiment of the present invention.
Figure 10:
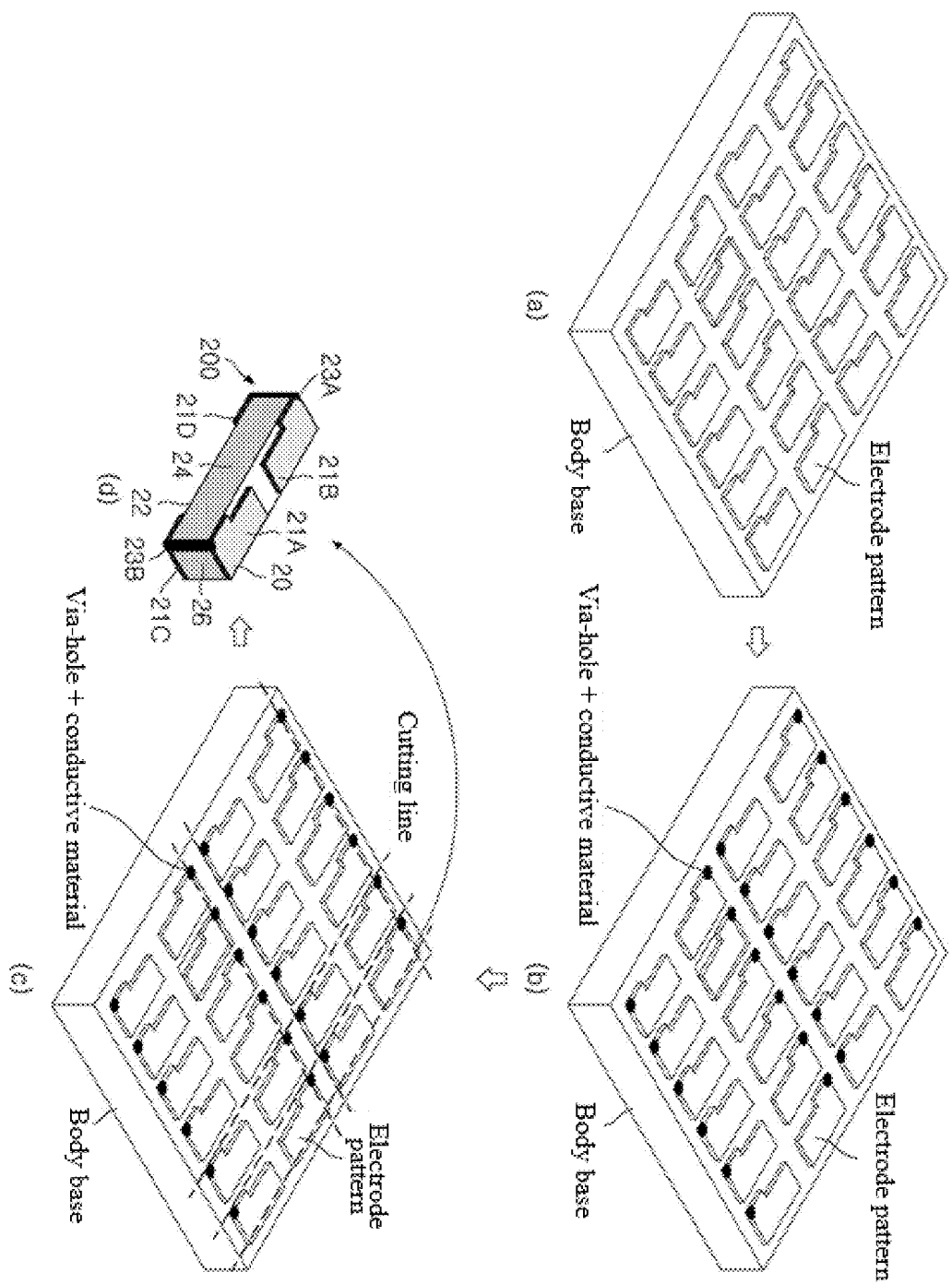
FIG. 10 schematically illustrates a method for constructing a body of a side view LED package according to a first embodiment of the present invention.

FIG. 8 illustrates (a) a perspective view and (b) a rear perspective view of a body 200 coupled with the LED unit. FIG. 9 is a flowchart illustrating a method for constructing the body 200. FIG. 10 schematically illustrates a method for constructing the body 200.

Referring to (a) and (b) of FIG. 8, the body 200 includes a first side 20 and a second side 22 parallel to each other and a third side 24 orthogonal to the first and second sides and facing a mount substrate (not illustrated) when mounted on the mount substrate. The body 200 has a rectangular parallelepiped shape including a fourth side 26 and a fifth side, which share edges in common with the third side 24, and a sixth side parallel to the third side, in addition to the first, second, and third sides.

A pair of first electrode patterns 21A and 21B (i.e. a 1-$1^{st}$ electrode pattern 21A and a 1-$2^{nd}$ electrode pattern 21B) corresponding to electrode pads of the LED chip 12 of the LED unit 100 are formed on the first side 20 of the body 200 and a pair of second electrode patterns 21C and 21D (i.e. a 2-$1^{st}$ electrode pattern 21C and a 2-$2^{nd}$ electrode pattern 21D) are formed on the second side 22 of the body 200. The pair of second electrode patterns 21C and 21D have the same shapes as the pair of first electrode patterns 21A and 21B, respectively. First and second vias 23A and 23B are formed at the edges where the third side 24 of the body 200 meets the fourth side and the fifth side 26. The first via 23A connects the first electrode pattern 21A to the second electrode pattern 21C. The second via 23B connects the first electrode pattern 21B to the second electrode pattern 21D. The vias 23A and 23B are formed when a body base including embedded vias formed by filling a metal in penetrating via holes is singulated into individual bodies. The vias 23A and 23B are exposed at edges of the body 200 by singulation of the body base along orthogonal cutting lines at the centers of the vias.

Each of the first electrode patterns 21A and 21B has a substantially L shape. The first electrode patterns 21A and 21B have side surfaces 21A-1 and 21B-11 that are formed along the edge between the first and third sides while facing a mount substrate when the side view LED package is mounted on the mount substrate and front sides 21A-2 and 21B-2 that are formed corresponding to the electrode pads of the LED chip 12 of the LED unit 100 on the first side while facing the LED unit, respectively. The CSP type LED unit 100 is mounted in contact with the front side 21A-2 of the first electrode pattern 21A and the front side 21B-2 of the first electrode pattern 21B.

The formation of the L-shaped electrode patterns having large areas on the first and second sides considerably prevents the LED chip 12 from being tilted when the LED chip 12 is soldered/bonded to the electrode patterns, ensuring high stability.

Two angled C-shaped soldering patterns are formed as portions of terminals at both sides of the third side 24 of the body 200. One of the soldering patterns is formed by the first electrode pattern 21A, the via 23A, and the second electrode pattern 21C. The other soldering pattern is formed by the second electrode pattern 21B, the via 23B, and the second electrode pattern 21D. Specifically, one of the soldering patterns is formed by the side surface 21A-1 of the first electrode pattern 21A, the side surface 21C-1 of the second electrode pattern 21C, and the via 23A. The other soldering pattern is formed by the side surface 21B-1 of the second electrode pattern 21B, the side surface 21D-1 of the second electrode pattern 21D, and the via 23B.

The soldering areas of the side view LED package 1000 according to this embodiment on the substrate can be increased by the angled C-shaped soldering patterns of the terminals formed in the body 200 compared to those of conventional packages. The increased soldering areas enable stable mounting of the side view LED package 1000 on the mount substrate 300. This facilitates electrical connection to the LED unit 100, achieving improved luminous efficiency.

In addition, the increased soldering areas can prevent tilting and non-uniform array of the side view LED package 1000 on the substrate 300.

Solders are formed on the angled C-shaped patterns. The side view LED package can be mounted on the mount substrate through the solders. The angled C-shaped patterns are formed only on the third side 24 of the body 200 and are not formed on the rear side opposite to the third side 24.

The method for constructing the body 200 including the exposed vias 23A and 23B includes forming a plurality of electrode patterns on a body base (S510, (a) of FIG. 10), forming via holes in the body base and filling a conductive material in the via holes to form vias (S520, (b) of FIG. 10), and singulating the body base such that the vias are exposed (S530, (c) of FIG. 10).

Specifically, in S510, a pair of L-shaped electrode patterns are arrayed on the upper surface of a substrate such that they are symmetric from left to right. Electrode patterns are also arrayed on the lower surface of the substrate. The upper electrode patterns have the same shapes as the lower electrode patterns.

In S520, via holes connecting the upper electrode patterns to the lower electrode patterns are formed, as illustrated in FIG. 8. That is, the via holes extend from the upper electrode patterns and the lower electrode patterns. A conductive material is filled in the via holes to form vias through which LED chips are electrically connected.

In S530, the body base is singulated such that the vias are exposed and the side surfaces of the first electrode patterns, the side surfaces of the second electrode patterns, and the vias form angled C-shaped soldering patterns.

Each of the angled C-shaped soldering patterns includes the side surface 21A-1 or 21B-1 of the first electrode pattern, the side surface 21C-1 or 21D-1 of the second electrode pattern, and the via 23A or 23B. The LED chip 12 can be soldered to the angled C-shaped patterns before the subsequent mounting of the side view LED package on the mount substrate.

Due to the use of the compact substrate, the side view LED package can be fabricated in a simple manner at low cost compared to conventional side view packages.

Figure 11:
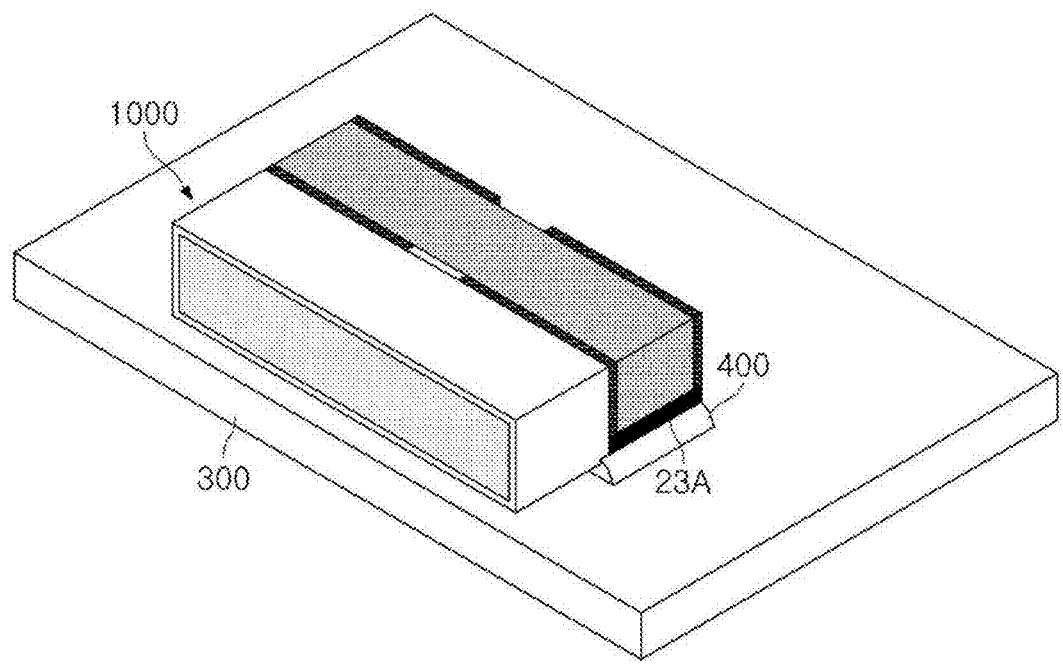
FIG. 11 illustrates (a) a perspective view and (b) a front view showing a state in which a side view LED package according to a first embodiment of the present invention is mounted on a mount substrate in a direction orthogonal to the light emission direction by surface mount technology (SMT)
Figure 11:
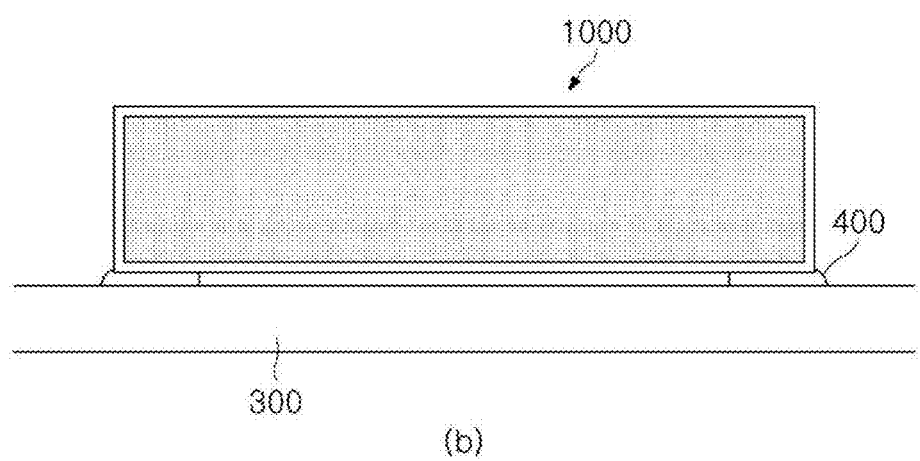

In FIG. 11, (a) is a perspective view illustrating a side view LED module including a side view LED package 1000 and a mount substrate 300 on which the side view LED package 1000 is mounted by surface mount technology (SMT) and (b) is a front view of the side view LED module. Referring to (a) and (b) of FIG. 11, the side view LED package 1000 is mounted on the mount substrate 300 in a direction orthogonal to the light emission direction by SMT. Solders 400 are applied to electrode patterns formed on the mount substrate 300 and vias 23A and 23B exposed at edges of a body 200 of the side view LED package 1000 are brought into contact with the solders 400 to fix side view LED package 1000. Thereafter, the solders 400 are cured by a suitable process such as reflow soldering to form solder joints through which the side view LED package 1000 can be more firmly fixed to the mount substrate 300.

The side view LED package 1000 of the present invention has higher luminance than previous side view LED packages. In addition, when the third side of the body orthogonal to the light emission direction is soldered in contact with the surface of the mount substrate, the side view LED package can be stably connected to the mount substrate and therefore it can be prevented from being tilted up, down, right and left and non-uniformly arrayed on the mount substrate.

Second Embodiment

Figure 12:
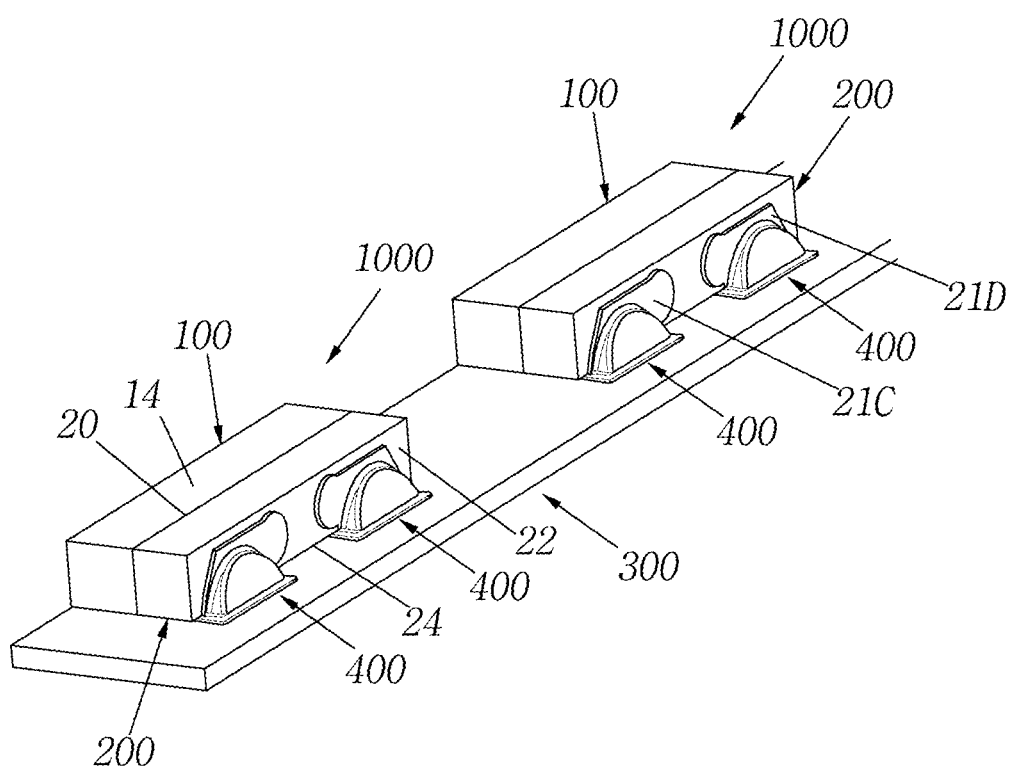
FIG. 12 is a rear perspective view illustrating a side view LED module according to a second embodiment of the present invention.
Figure 13:
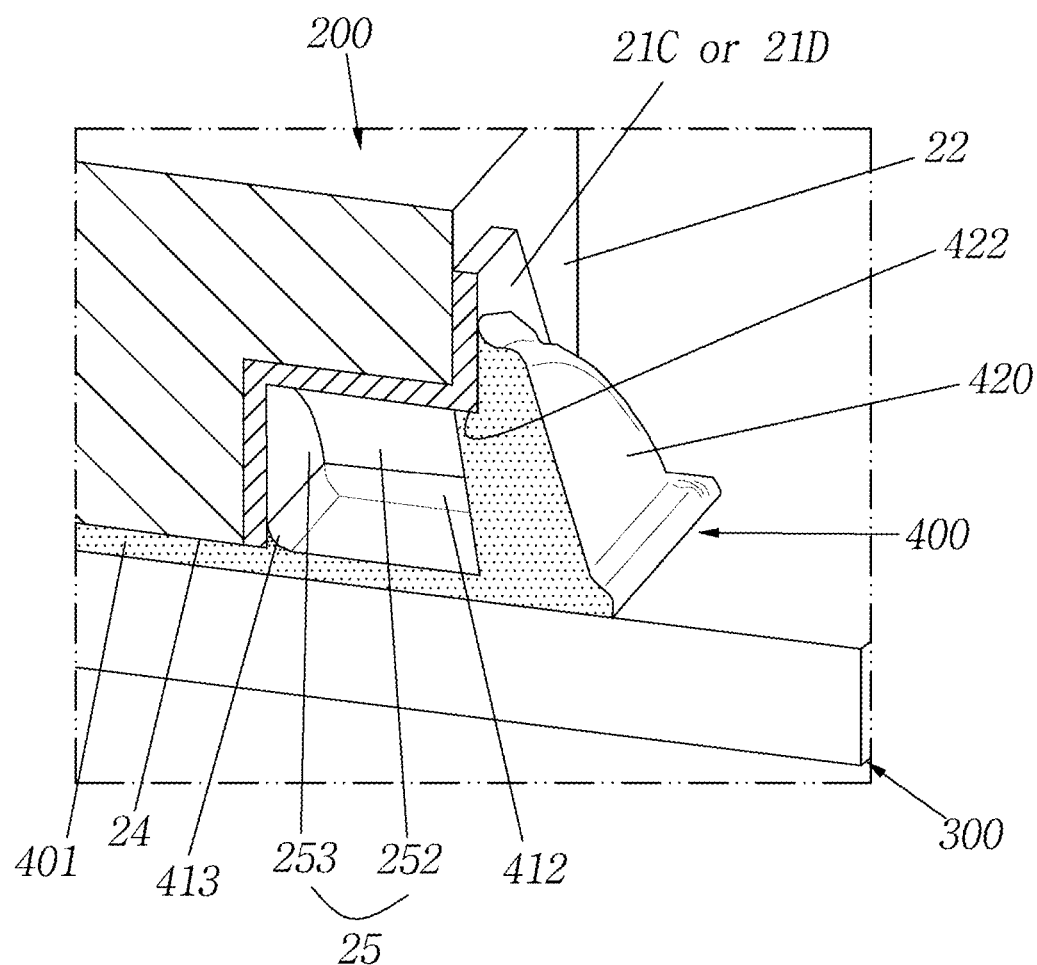
FIG. 13 is a partially cut-away, enlarged perspective view illustrating the structures of a terminal and a solder joint of a side view LED module according to a second embodiment of the present invention.
Figure 14:
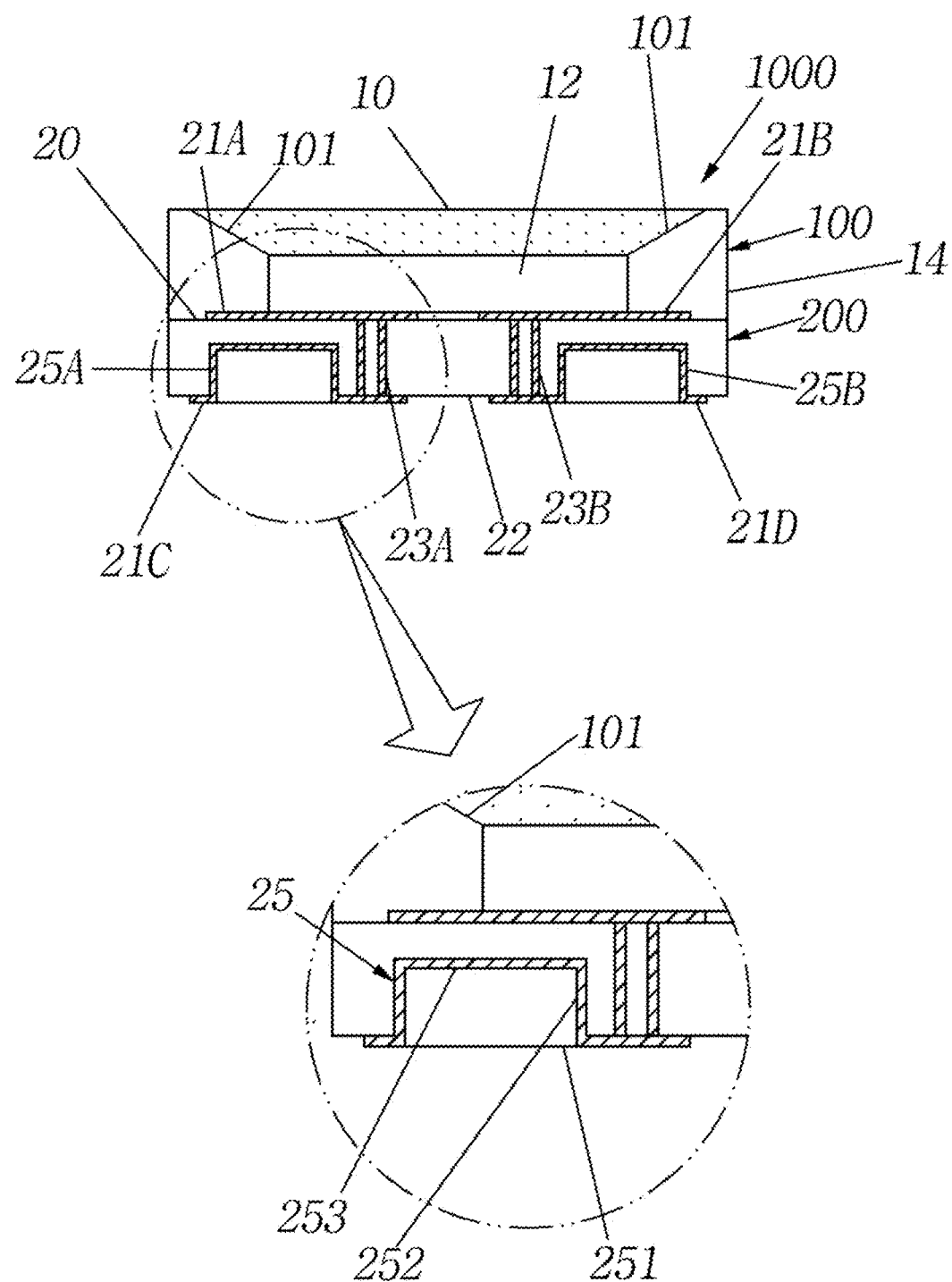
FIG. 14 is a longitudinal cross-sectional view of a side view LED package of a side view LED module according to a second embodiment of the present invention.
Figure 15:
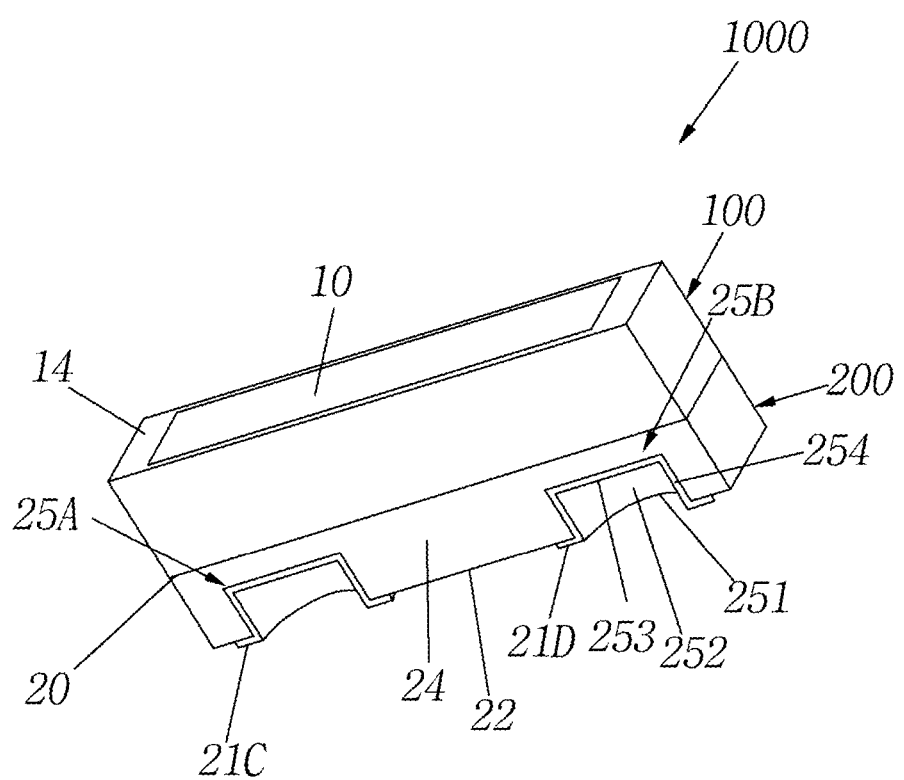
FIG. 15 is a perspective view illustrating a side view LED package of a side view LED module according to a second embodiment of the present invention from which a side to be bonded to a mount substrate is visible.
Figure 16:
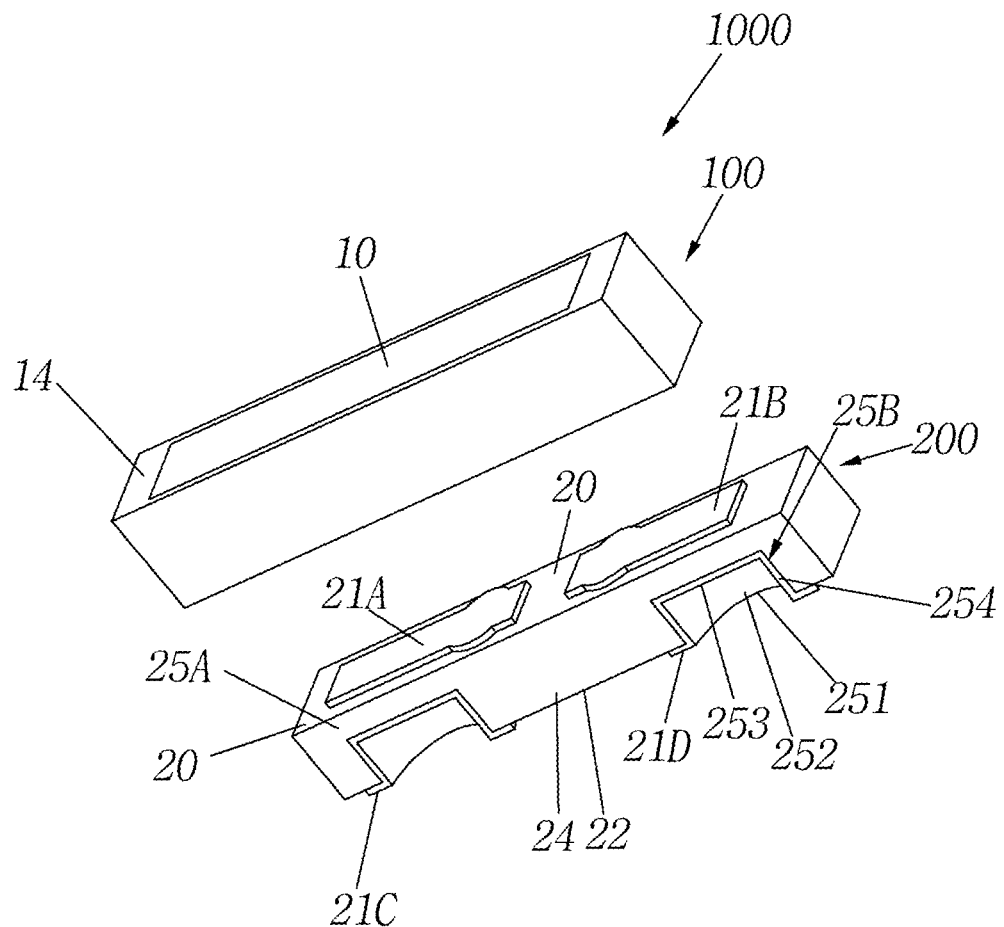
FIG. 16 is an exploded perspective view illustrating a side view LED package of a side view LED module according to a second embodiment of the present invention.
Figure 17:
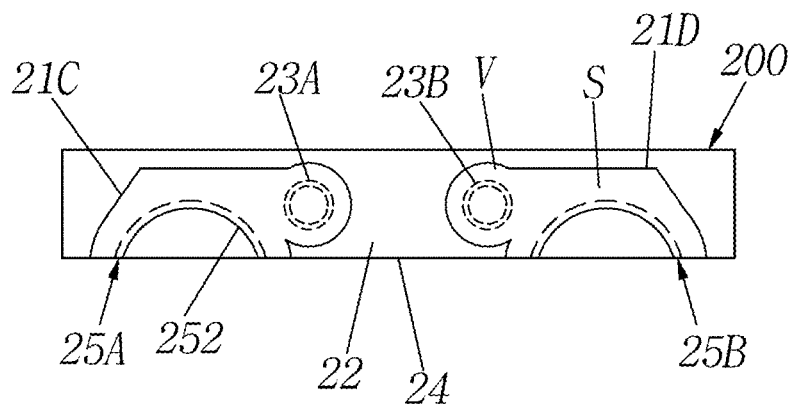
FIG. 17 is an elevation view illustrating a side view LED package of a side view LED module according to a second embodiment of the present invention from which a side opposite to a light emission side is visible.

FIG. 12 is a rear perspective view illustrating a side view LED module according to a second embodiment of the present invention. FIG. 13 is a partially cut-away, enlarged perspective view illustrating the structures of a terminal and a solder joint of the side view LED module. FIG. 14 is a longitudinal cross-sectional view of the side view LED package of the side view LED module. FIG. 15 is a perspective view illustrating the side view LED package from which a side to be bonded to a mount substrate is visible. FIG. 16 is an exploded perspective view illustrating the side view LED package. FIG. 17 is an elevation view illustrating the side view LED package from which a side opposite to a light emission side is visible.

As illustrated in FIGS. 12 to 17, the side view LED module includes a mount substrate 300 and at least one side view LED package 1000 mounted on the mount substrate 300.

The side view LED package 1000 includes a body 200 and a chip scale package (CSP) type LED unit 100 mounted on the body 200. As will be described in detail below, the LED unit 100 includes an LED chip 12 and the body 200 has terminals electrically connected to electrode pads of the LED chip 12.

Electrode patterns corresponding to the terminals are formed on the mount substrate 300. The side view LED module includes solder joints 400 through which the terminals of the side view LED package 1000 are fixed to the mount substrate 300 and are electrically connected to the corresponding electrode patterns formed on the mount substrate 300. Although not illustrated, several pairs of electrode patterns are formed on the mount substrate 300.

The body 200 includes a first side 20 on which the LED unit 100 is bonded, a second side 22 parallel to the first side 20, and a third side 24 orthogonal to the first and second sides 20 and 22. The LED unit 100 emits light in a direction opposite to the direction in which the body 200 is coupled with the LED unit, i.e. a direction opposite to the direction toward the second side 22 of the body 200.

The third side faces the mount substrate 300 when the side view LED package 1000 is mounted on the mount substrate 300. The LED unit 100 has a top view type CSP structure but the LED package 1000 including the body 200 and the LED unit 100 may be of a side view type because the body 200 coupled with the LED unit 100 can be mounted on the mount substrate 300 in a direction orthogonal to the coupling direction of the body 200.

The LED unit 100 as an element of the side view LED package 1000 includes a wavelength converting sheet 10, an LED chip 12, and a reflector 14. The wavelength converting sheet 10 is attached to one side (i.e. a light emitting side) of the LED chip 12 and both sides 101 of the wavelength converting sheet 10 are inclined. For example, the wavelength converting sheet 10 may include a phosphor. Due to these inclined sides, the width or cross-sectional area of the wavelength converting sheet 10 increases from the side of the wavelength converting sheet 10 attached with the LED chip 12 to the opposite side. The reflector 14 covers the side surfaces of the LED chip 12 and the side surfaces of the wavelength converting sheet 10. The LED chip 12 includes an electrode side on which first and second conductive electrode pads are disposed and a light emitting side opposite to the electrode side. The electrode side is bonded to a first side of the body 200. The reflector 14 includes a side facing the mount substrate 300 in a state in which the side view LED package 1000 is mounted on the mount substrate 300. The facing side of the reflector 14 preferably lies in the same plane as the third side of the body 200. Furthermore, the reflector 14 includes four outer sides in addition to the light emitting side and the electrode side. The four outer sides lie in the same plane as the four outer sides of the body except the first and second sides.

A pair of first electrode patterns 21A and 21B corresponding to the electrode pads of the LED chip 12 of the LED unit 100 are formed on the first side 20 of the body 200 and a pair of second electrode patterns 21C and 21D corresponding to the pair of first electrode patterns 21A and 21B are formed on the second side 22 of the body 200. The first electrode patterns 21A and 21B are a $1\text{-}1^{st}$ electrode pattern 21A and a $1\text{-}2^{nd}$ electrode pattern 21B. The second electrode patterns 21C and 21D are a $2\text{-}1^{st}$ electrode pattern 21C and a $2\text{-}2^{nd}$ electrode pattern 21D. The body 200 includes a via 23A that linearly extends from the first side 20 to the second side 22 to connect the first electrode pattern 21A to the second electrode pattern 21C. The body 200 includes a via 23B that linearly extends from the first side 20 to the second side 22 to connect the first electrode pattern 21B to the second electrode pattern 21D. A pair of concave electrodes 25A and 25B (hereinafter also collectively referred to as concave electrodes 25) are disposed at the third side 24 of the body 200. Reference numerals 25A and 25B represent a first concave electrode and a second concave electrode. Each of the first and second concave electrodes 25A and 25B extends from the second side 22 to the edge where the second side 22 meets the third side 24. The $1\text{-}1^{st}$ electrode pattern 21A, the first via 23A, the $2\text{-}1^{st}$ electrode pattern 21C, and the first concave electrode 25A are connected as a whole to constitute a first terminal connected to the first conductive electrode pad of the LED chip 12. The $1\text{-}2^{nd}$ electrode pattern 21B, the second via 23B, the $2\text{-}2^{nd}$ electrode pattern 21D, and the second concave electrode 25B are connected as a whole to constitute a second terminal connected to the second conductive electrode pad of the LED chip 12. In the first terminal, the primary surface (i.e. the horizontal portion) of the $2\text{-}1^{st}$ electrode pattern 21C can be in contact with the solder joint on the second side of the body, the side surface (i.e. the vertical edge side) of the $2\text{-}1^{st}$ electrode pattern 21C can be in contact with the solder joint on the third side of the body, and the first concave electrode 25A can be in contact with the solder joint over a very large area on the second and third sides of the body. In the second terminal, the primary surface (i.e. the horizontal portion) of the $2\text{-}2^{nd}$ electrode pattern 21D can be in contact with the solder joint on the second side of the body, the side surface (i.e. the vertical edge side) of the $2\text{-}2^{nd}$ electrode pattern 21D can be in contact with the solder joint on the third side of the body, and the second concave electrode 25B can be in contact with the solder joint over a very large area on the second and third sides of the body.

Each of the first and second concave electrodes 25A and 25B has a concave space whose cross section is hemispherical or arched relative to the third side. Each of the first and second concave electrodes 25 extends from a hemispherical or arched opening 251 formed at the second side 22 until shortly before the first side 20 of the body 200 is reached. Here, each of the first and second concave electrodes 25A and 25B is formed by a metal layer formed on the inner wall surface of the cross-sectionally hemispherical or arched space in the body 200. The metal layer can be formed by plating.

Each of the first and second concave electrodes 25A and 25B includes inner wall surfaces. The inner wall surfaces include a concave inner wall surface 252 extending a distance from the hemispherical or arched opening 251 toward the first side and a vertical inner wall surface 253 formed at one end of the concave inner wall surface 252 and facing the opening 251. Each of the concave electrodes 25A and 25B includes edge sides 254 lying in the same plane as the third side 24 of the body.

The second electrode pattern 21C or 21D is formed on the second side 22 of the body and includes a solder bonding area S and a via connection area V protruding laterally from the outer line of the solder bonding area S. The opening of the concave electrode 25A or 25B is formed inside the solder bonding area S. The first concave electrode 25A connected to the $2\text{-}1^{st}$ electrode pattern 21C is disposed adjacent to the second concave electrode 25B connected to the $2\text{-}2^{nd}$ electrode pattern 21D. Particularly, the distance between the solder bonding area S of the $2\text{-}1^{st}$ electrode pattern 21C and the solder bonding area S of the $2\text{-}2^{nd}$ electrode pattern 21D is preferably larger than the distance between the via connection area V of the $2\text{-}1^{st}$ electrode pattern 21C and the via connection area V of the $2\text{-}2^{nd}$ electrode pattern 21D. This arrangement ensures a sufficient distance between the solder joint connected to the $2\text{-}1^{st}$ electrode pattern 21C and the first concave electrode 25A and the solder joint connected to the $2\text{-}2^{nd}$ electrode pattern 21D and the second concave electrode 25B, contributing to the prevention of defects such as shorting.

The first and second vias 23A and 23B are connected to the via connection areas V of the second electrode patterns 21C and 21D formed on the second side 22 of the body and are connected to the first electrode patterns 21A and 21B formed on the first side 20 of the body, respectively. As mentioned previously, the first electrode patterns 21A and 21B (i.e. the $1\text{-}1^{st}$ electrode pattern 21A and the $1\text{-}2^{nd}$ electrode pattern 21B) are connected to the first and second conductive electrode pads of the LED chip 12 of the LED unit 100, respectively.

As best illustrated in FIG. 13, each of the solder joints 400 fills only a portion of the inner space of the corresponding concave electrode 25 but ensures a robust and reliable connection of the corresponding terminal of the body 200 to the corresponding electrode pattern formed on the mount substrate 300. In this embodiment, each of the solder joints 400 is flowable during reflow before it is finally hardened. Each of the solder joints 400 includes a base portion 401 and inner fillets 412 and 413 extending upward along the inner wall surfaces of the concave electrode 25 from the base portion. The base portion 401 is integrally formed with the inner fillets 412 and 413. Each of the solder joints 400 further includes an outer fillet 420.

As mentioned earlier, the inner wall surfaces of the concave electrode 25 include a concave inner wall surface 252 extending a distance from the hemispherical or arched opening 251 toward the first side 20 of the body 200 and a vertical inner wall surface 253 formed at one end of the concave inner wall surface 252 and facing the opening 251.

The inner fillets 412 and 413 of each of the solder joints 400 include a first inner fillet 413 formed in contact with the vertical inner wall surface 253 and second inner fillets 412 formed in contact with both left and right sides of the concave inner wall surface 252. Here, when the solder is melted by heating, the solder becomes flowable. The flowable solder ascends to heights along the concave inner wall surface 252 and the vertical inner wall surface 253 and is hardened at the heights to form the inner fillets 412 and 413, respectively. The inner fillets 412 and 413 are not obstacles to reducing the distance between the side view LED packages 1000 because they are not exposed to the outside from the body 200.

The inner fillets 412 and 413 are in contact with the inner wall surfaces of the concave electrode 25 over large areas, resulting in stronger and more reliable fixing of the side view LED package 1000 to the mount substrate 300.

Particularly, the second inner fillets 412 formed in contact with both left and right sides of the concave inner wall surface 252, the first inner fillet 413 formed in contact with the vertical inner wall surface 253, and the outer fillet 420 fix the body 200 in four directions to prevent the side view LED package 1000 from unintended tilting. The outer fillet 420 will be explained in more detail below.

As mentioned earlier, the base portion, the inner fillets, and the outer fillet 420 are integrally formed in the solder joint 400. The outer fillet 420 is formed in contact with the surface of the second electrode pattern 21C or 21D. When the solder is melted by heating, the solder becomes flowable. The flowable solder ascends to a height along the second electrode pattern 21C or 21D and is hardened at the height to form the outer fillet 420. One side of the outer fillet 420 is connected to the base portion 401 and the opposite side thereof extends to a position where the opening 251 of the concave electrode 25 is closed completely. The outer fillet 420 is formed in contact with the surface of the second electrode pattern 21C or 21D while completely closing the opening 251, ensuring more robust fixing of the side view LED package 1000 to the mount substrate 300. In addition, a portion of the outer fillet 420 enters the inner space of the concave electrode 25 through the opening 251 to form a stepped portion 422 that supports the concave inner wall surface 253. The stepped portion 422 is in contact with the concave inner wall surface 253 and the surface of the second electrode pattern 21C or 21D meeting each other, resulting in a further increased bonding area between the body 200 and the solder joint 400.

The side view LED package 1000 can be most stably fixed to the surface of the mount substrate 300 when the second inner fillets 412 of the solder joint 400 are formed in contact with both sides of the concave inner wall surface 252 of the concave electrode 250, the first inner fillet 413 of the solder joint 400 is formed in contact with the concave inner wall surface 253 of the concave electrode 250, and the outer fillet 420 of the solder joint 400 is formed in contact with the second electrode pattern 21C or 21D while completely closing the opening 251, as described above. For the formation of the solder joint 400 having the above structure, it is necessary to well manage the soldering conditions such as the solder amount and the reflow soldering time. It is desirable that the solder joint 400 fills only a portion of the inner space of the concave electrode 250. If the soldering conditions are managed such that the solder joint 400 completely fills the inner space of the concave electrode 250, it is disadvantageous from the viewpoint of economic efficiency. Further, the excessive volume of the solder may cause serious defects such as excessive lifting of the side view LED package from the surface of the mount substrate. It is thus preferred that the solder joint 400 is formed such that only very small portions of the inner fillets and the outer fillet are present in the inner space of the concave electrode 250. Thus, a space unoccupied by the solder joint 400 is formed in the inner space of the concave electrode 250. Preferably, the unoccupied space accounts for less than ~30% of the inner space of the concave electrode 250.

As in the first embodiment, the LED unit 100 has a top view type CSP structure including a reflector but the LED package 1000 including the body 200 and the LED unit 100 may be of a side view type because the body 200 coupled with the LED unit 100 is mounted on a mount substrate 300 in a direction orthogonal to the coupling direction of the body 200.

A method for manufacturing the side view LED module according to the second embodiment of the present invention will be described with reference to FIGS. 12 to 17. The method includes: preparing a mount substrate 300; preparing a side view LED package 1000 including a body 200 and an LED unit 100 coupled with the body 200 and emitting light in a direction opposite to the coupling direction of the body; and mounting the side view LED package on the mount substrate such that terminals of the side view LED package are fixed to the mount substrate by solder joints. As best illustrated in FIG. 16, the preparation of a side view LED package includes constructing an LED unit 100 and constructing a body 200 including a first side 20 to which the LED unit 100 is bonded, a second side 22 parallel to the first side 20, a third side 24 orthogonal to the first and second sides 20 and 22 and facing the mount substrate 300, and terminals including concave electrodes 25A and 25B extending from openings 251 formed at the second side 22 toward the first side 20 and recessed relative to the third side 24. The terminals are formed to include first electrode patterns 21A and 21B formed on the first side 20 of the body 200, second electrode patterns 21C and 21D formed on the second side 22 of the body 200 and connected to the concave electrodes 25A or 25B around the corresponding openings 251 of the concave electrodes, and vias 23A and 23B connecting the first electrode patterns to the second electrode patterns, in addition to the concave electrodes 25A and 25B, respectively.

Figure 18:
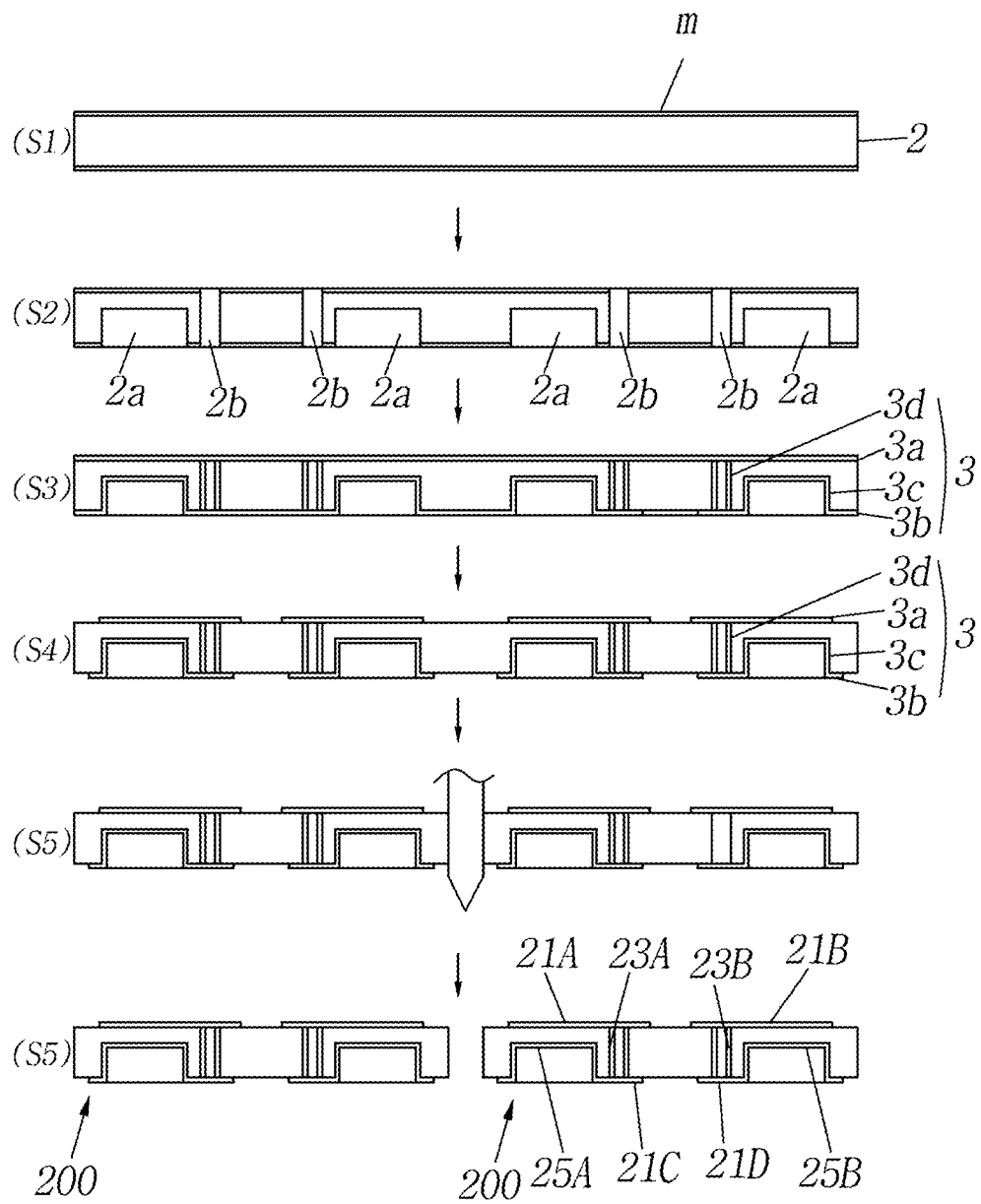
FIG. 18 cross-sectionally illustrates the individual steps of a method for constructing a body.
Figure 19:
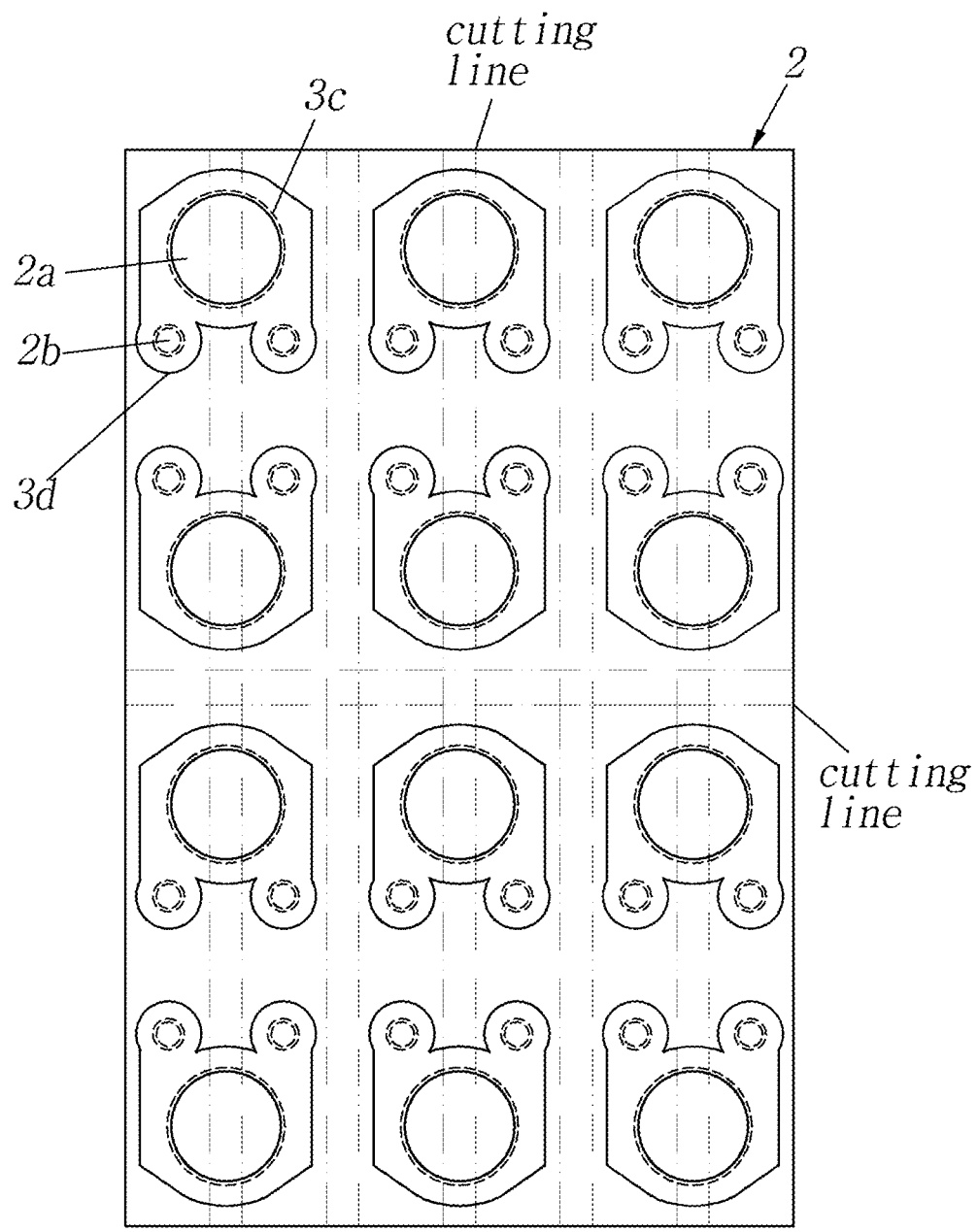
FIGS. 19 and 20 are elevation views illustrating the step of singulating a body base in a method for constructing a body.
Figure 20:
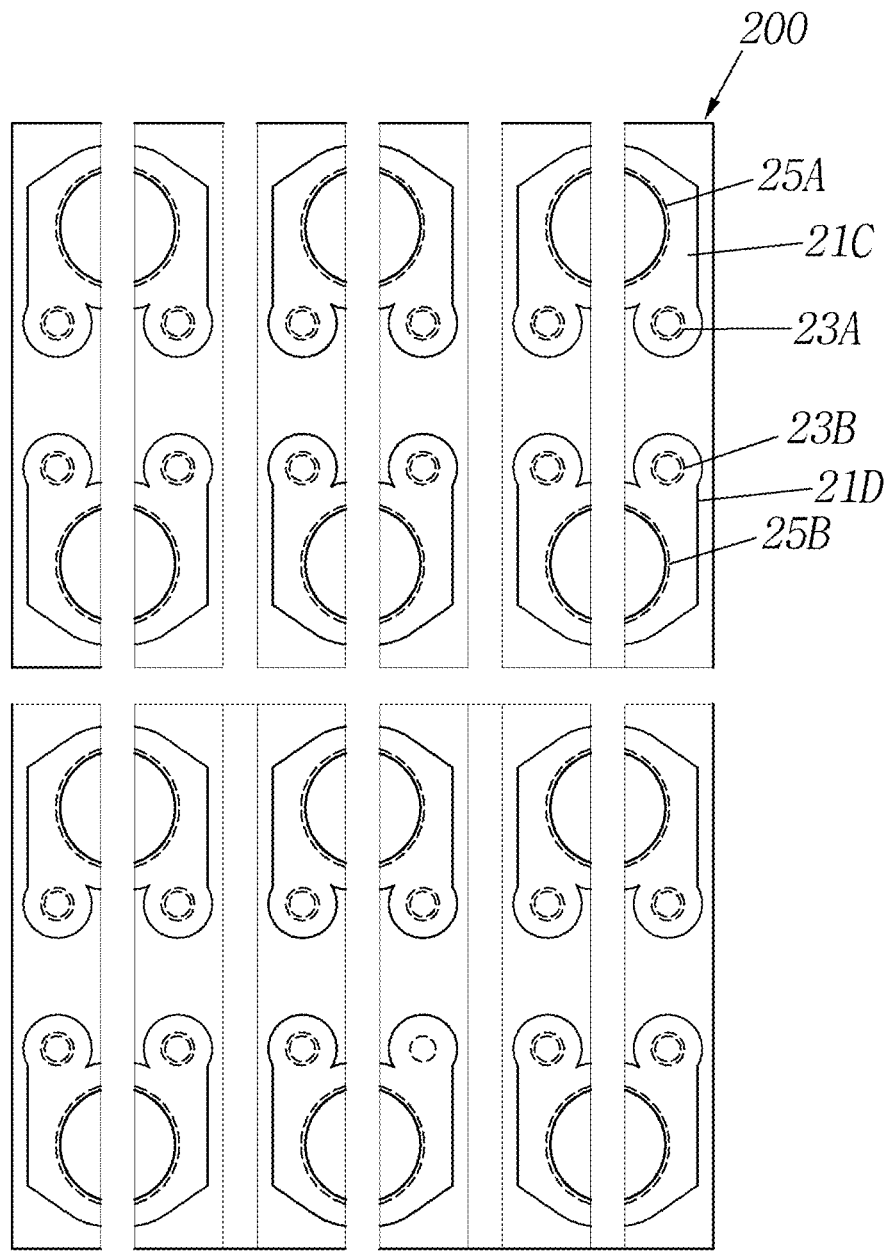

FIG. 18 cross-sectionally illustrates the individual steps of a method for constructing the body 200. FIGS. 19 and 20 are elevation views illustrating the step of singulating a body base in the method for constructing the body.

Referring first to FIG. 18, the construction of the body 200 includes: preparing a body base 2 including a top surface and a bottom surface (S1); forming blind holes 2a extending a depth from the bottom surface of the body base 2 and through-holes 2b penetrating the body base 2 (S2); forming metal layers 3 covering the inner surfaces of the blind holes 2a, the inner surfaces of the through-holes 2b, and the top and bottom surfaces of the body base 2 (S3); patterning the metal layer 3a formed on the top surface and the metal layer 3b formed on the bottom surface (S4); and singulating the body base 2 (S5). In S1, a body base 2 is prepared. The body base 2 is based on an electrically insulating material. A seed metal layer m for plating may be previously formed on the surface of the body base 2. The seed metal layer m is preferably a copper film. In S2, blind holes 2a and through-holes 2b are formed by a physical or chemical process. Preferably, the depth of the blind hole 2a is approximately one-half of the thickness of the body base. The blind holes 2a and the through-holes 2b are formed in this order or in the reverse order. The end sides of the blind holes 2a are preferably vertical without inclination.

S3 includes plating or depositing a metal over the entire area of the body base 2. The metal is preferably copper. As a result of the plating or deposition, metal layers are formed on the inner surfaces of the blind holes 2a and the inner surfaces of the through-holes 2b. After completion of the entire procedure including the subsequent steps, the metal layers 3c formed in the blind holes 2a become concave electrodes 25A and 25B and the metal layers 3d formed in the through-holes 2b become vias 23A and 23B. In S4, masks are disposed on the top and bottom surfaces of the body base 2 in which the metal layers are formed, and then the metal layer 3a formed on the top surface of the body base 2 and the metal layer 3b formed on the bottom surface of the body base 2 are patterned using the masks. The metal layer 3a formed on the top surface of the body base 2 and the metal layer 3b formed on the bottom surface of the body base 2 are patterned in this order or in the reverse order. In S5, singulation is performed using a suitable sawing tool or a laser. In S5, the body base 2 is singulated into several bodies 20. The bodies 20 are coupled to corresponding LED units, as described above.

Referring to FIG. 18 together with FIGS. 19 and 20, when the body base 2 is singulated, the metal layer 3c formed in each blind hole 2a is cut into two concave electrodes 25A and 25B. The body base 2 is singulated into a plurality of bodies 200, each of which is the same as that described above. Each of the bodies 200 includes hemispherical or arched concave electrodes 25A and 25B obtained from the metal layers 3c formed in the divided blind holes 2a, vias 23A and 23B obtained from the metal layers 3d formed in the through-holes 2b, first electrode patterns 21A and 21B formed by patterning the metal layer 3a formed on the top surface of the body base 2, and second electrode patterns 21C and 21D formed by patterning the metal layer 3b formed on the bottom surface of the body base 2.

As in the first embodiment, the construction of the LED unit includes: producing wavelength converting sheets, each of which includes inclined side surfaces formed by oblique cutting; preparing LED chips; bonding each of the wavelength converting sheets to one side of the corresponding LED chip; arraying the LED chips bonded with the wavelength converting sheets and disposing a reflective member so as to surround the side surfaces of the wavelength converting sheets and the side surfaces of the LED chips; and singulating the reflective member.

Third Embodiment

Figure 21:
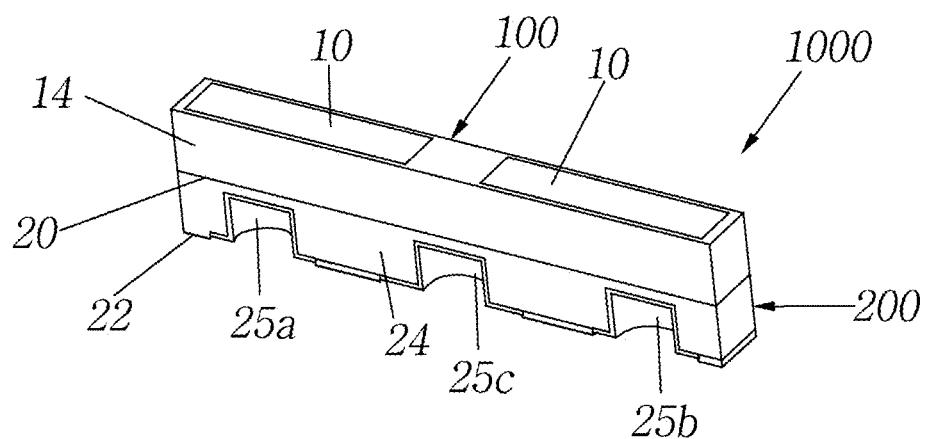
FIG. 21 is a perspective view illustrating a side view LED package according to a third embodiment of the present invention.
Figure 22:
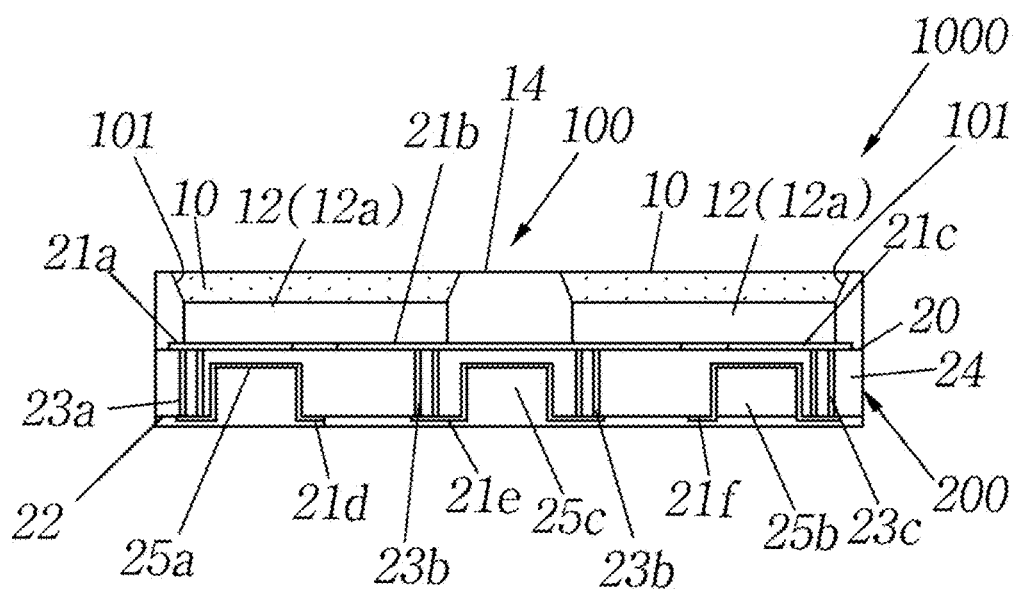
FIG. 22 is a longitudinal cross-sectional view of a side view LED package according to a third embodiment of the present invention.
Figure 23:
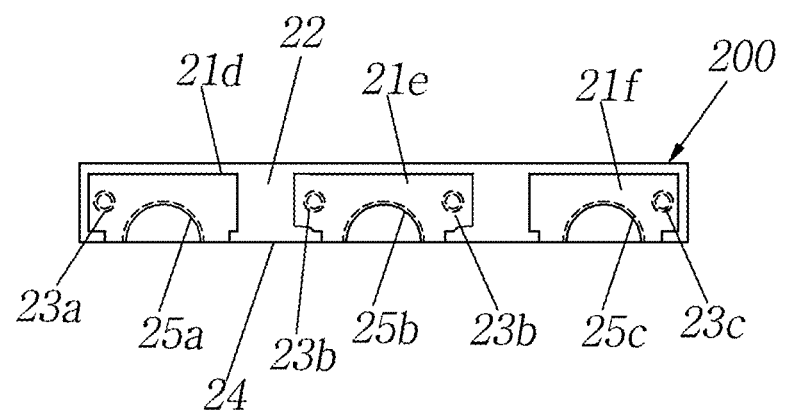
FIG. 23 is a rear view of a side view LED package according to a third embodiment of the present invention.

FIGS. 21, 22, and 23 are a perspective view, a longitudinal cross-sectional view, and a rear view illustrating a side view LED package according to a third embodiment of the present invention, respectively.

The side view LED package 1000 can be mounted on a mount substrate (not illustrated). The mount substrate and the side view LED package 1000 constitute a side view LED module. The side view LED package 1000 may be provided in plurality.

Solder joints can be used as means to fix the side view LED package 1000 to the mount substrate. The solder joints have substantially the same structure as described in the second embodiment. Corresponding reference numerals in the second embodiment apply to the unexplained reference numerals in this embodiment.

In this embodiment, the side view LED package 1000 includes a body 200 and a chip scale package (CSP) type LED unit 100 mounted on the body 200. The LED unit 100 includes two LED chips 12 arranged in parallel to each other. The body 200 has terminals electrically connected to electrode pads of the two LED chips 12. Electrode patterns corresponding to the terminals are formed on the mount substrate on which the side view LED package 1000 is mounted.

As in the previous first embodiment, the body 200 includes a first side 20 to which the LED unit 100 is bonded, a second side 22 parallel to the first side 20, a third side 24 orthogonal to the first and second sides 20 and 22. The LED unit 100 emits light in a direction opposite to the direction in which the body 200 is coupled with the LED unit, i.e. a direction opposite to the direction toward the second side 22 of the body 200. The third side faces the mount substrate. The LED unit 100 includes two wavelength converting sheets 10 attached to the light emitting sides of the two LED chips 12 and a reflector 14 covering the side surfaces of the two LED chips 12 and the side surfaces of the two wavelength converting sheets 10, in addition to the two LED chips 12 arranged in parallel to each other. Both sides of each of the wavelength converting sheets 10 are inclined by oblique cutting. Due to these inclined sides, the width or cross-sectional area of the wavelength converting sheet 10 increases from the side of the wavelength converting sheet 10 attached with the LED chip 12 to the opposite side. Each of the two LED chips 12 includes an electrode side on which first and second conductive electrode pads are disposed and a light emitting side opposite to the electrode side. The electrode side is bonded to the first side of the body 200. The reflector 14 includes a side facing the mount substrate in a state in which the side view LED package 1000 is mounted on the mount substrate. The facing side of the reflector 14 lies in the same plane as the third side of the body 200. Furthermore, the reflector 14 includes four outer sides in addition to the light emitting side and the electrode side. Preferably, the four outer sides lie in the same plane as the four outer sides of the body except the first and second sides.

First electrode patterns corresponding to the electrode pads of the two LED chips 12 of the LED unit 100 are formed on the first side 20 of the body 200. Second electrode patterns corresponding to the first electrode patterns are formed on the second side 22 of the body 200. The body 200 includes vias that connect the first electrode patterns to the second electrode patterns and concave electrodes that are recessed relative to the third side 24 and connected to the second electrode patterns.

In this embodiment, the first electrode patterns include a $1\text{-}1^{st}$ electrode pattern 21a, a $1\text{-}2^{nd}$ electrode pattern 21b, and a $1\text{-}3^{rd}$ electrode pattern 21c. The second electrode patterns include a $2\text{-}1^{st}$ electrode pattern 21d, a $2\text{-}2^{nd}$ electrode pattern 21e, and a $2\text{-}3^{rd}$ electrode pattern 21f.

The vias include a first via 23a connecting the $1\text{-}1^{st}$ electrode pattern 21a to the $2\text{-}1^{st}$ electrode pattern 21d, two second vias 23b connecting the $1\text{-}2^{nd}$ electrode pattern 21b to the $2\text{-}2^{nd}$ electrode pattern 21e, and a third via 23c connecting the $1\text{-}3^{rd}$ electrode pattern 21c to the $2\text{-}3^{rd}$ electrode pattern 21f.

The two LED chips are a first LED chip 12a and a second LED chip 12b. The first conductive electrode pads and the second conductive electrode pads of the two LED chips 12a and 12b are exposed toward the rear of the reflective member 14, i.e. toward the body 200.

Here, the first conductive electrode pad of the first LED chip 12a is connected to the $1\text{-}1^{st}$ electrode pattern 21a, the second conductive electrode pad of the second LED chip 12b is connected to the $1\text{-}3^{rd}$ electrode pattern 21c, and the second conductive electrode pad of the first LED chip 12a and the first conductive electrode pad of the second LED chip 12b are connected to the $1\text{-}2^{nd}$ electrode pattern 21b. With this arrangement, the first LED chip 12a and the second LED chip 12b can be connected in series with each other.

Alternatively, the first conductive electrode pad of the first LED chip 12a may be connected to the $1\text{-}1^{st}$ electrode pattern 21a, the first conductive electrode pad of the second LED chip 12b may be connected to the $1\text{-}3^{rd}$ electrode pattern 21c, and the second conductive electrode pad of the first LED chip 12a and the second conductive electrode pad of the second LED chip 12b may be connected to the 1-2$^{nd}$ electrode pattern 21b. With this arrangement, the first LED chip 12a and the second LED chip 12b may be connected in parallel to each other.

The concave electrodes include a first concave electrode 25a connected to the 2-1$^{st}$ electrode pattern 21d and a second concave electrode 25b connected to the 2-3$^{rd}$ electrode pattern 21f. The two second vias 23b connect the 1-2$^{nd}$ electrode pattern 21b to the 2-2$^{nd}$ electrode pattern 21e. A concave electrode 25c connected to the 2-2$^{nd}$ electrode pattern 21e is formed in the central area of the 2-2$^{nd}$ electrode pattern 21e between the two second vias 23b. Here, the concave electrode 25c connected to the 2-2$^{nd}$ electrode pattern 21e functions as a heat sink rather than as an electrode.

What is claimed is:

1. A side view LED module comprising:
a mount substrate;
a side view LED package comprising an LED unit and a body comprising a first side to which the LED unit is bonded, a second side parallel to the first side, a third side orthogonal to the first and second sides and facing the mount substrate, and terminals formed on the first, second, and third sides; and
solder joints through which the terminals are electrically connected to the mount substrate,
wherein each of the terminals comprises an opening formed at the second side and a concave electrode extending from the opening toward the first side and recessed relative to the third side, and
wherein each of the solders fills only a portion of an inner space of the concave electrode and comprises a base portion formed on the third side and inner fillets extending upward along inner wall surfaces of the concave electrode from the base portion.

2. The side view LED module according to claim 1, wherein each of the terminals comprises a first electrode pattern formed on the first side, a second electrode pattern formed on the second side and connected to the corresponding concave electrode around the opening, and a via connecting the first electrode pattern to the second electrode pattern.

3. The side view LED module according to claim 1, wherein the inner wall surfaces of each of the concave electrodes comprise a concave inner wall surface extending a distance from the opening and a vertical inner wall surface formed at one end of the concave inner wall surface and parallel to the opening.

4. The side view LED module according to claim 3, wherein the inner fillets comprise a first inner fillet in contact with the vertical inner wall surface and second inner fillets in contact with both sides of the concave inner wall surface.

5. The side view LED module according to claim 2, wherein each of the solder joints further comprises an outer fillet completely closing the corresponding opening and in contact with the corresponding second electrode pattern around the opening.

6. The side view LED module according to claim 5, wherein the outer fillet comprises a stepped portion supporting the concave inner wall surface of the corresponding concave electrode.

7. The side view LED module according to claim 2, wherein the second electrode pattern comprises a solder bonding area around the corresponding opening and a via connection area protruding laterally from the outer line of the solder bonding area.

8. The side view LED module according to claim 3, wherein the concave inner wall surface has a hemispherical or arched shape in cross section.

9. The side view LED module according to claim 2, wherein the LED unit comprises an LED chip having an electrode side connected with the first electrode patterns and a light emitting side opposite to the electrode side, a wavelength converting sheet arranged on the light emitting side of the LED chip, and a reflector disposed surrounding side surfaces of the LED chip and side surfaces of the wavelength converting sheet.

10. The side view LED module according to claim 9, wherein the wavelength converting sheet comprises inclined side surfaces formed by oblique cutting.

11. The side view LED module according to claim 9, wherein the reflector comprises a side coplanar with the third side.

12. The side view LED module according to claim 2, wherein the LED unit comprises:
a first LED chip and a second LED chip, each of which has an electrode side on which first and second conductive electrodes are connected to the first electrode patterns and a light emitting side opposite to the electrode side;
a first wavelength converting sheet and a second wavelength converting sheet arranged on the light emitting side of the first LED chip and the light emitting side of the second LED chip, respectively; and
a reflector disposed surrounding the side surfaces of the first LED chip and the first wavelength converting sheet and the side surfaces of the second LED chip and the second wavelength converting sheet.

13. The side view LED module according to claim 12, wherein the first electrode patterns comprise a 1-1$^{st}$ electrode pattern, a 1-2$^{nd}$ electrode pattern, and a 1-3$^{rd}$ electrode pattern; the second electrode patterns comprise a 2-1$^{st}$ electrode pattern, a 2-2$^{nd}$ electrode pattern, and a 2-3$^{rd}$ electrode pattern; and the vias comprise a first via connecting the 1-1$^{st}$ electrode pattern to the 2-1$^{st}$ electrode pattern, one or more second vias connecting the 1-2$^{nd}$ electrode pattern to the 2-2$^{nd}$ electrode pattern, and a third via connecting the 1-3$^{rd}$ electrode pattern to the 2-3$^{rd}$ electrode pattern.

14. The side view LED module according to claim 13, wherein the first conductive electrode of the first LED chip is connected to the 1-1$^{st}$ electrode pattern; the second conductive electrode of the second LED chip is connected to the 1-3$^{rd}$ electrode pattern; and the second conductive electrode of the first LED chip and the first conductive electrode of the second LED chip are connected to the 1-2$^{nd}$ electrode pattern.

15. The side view LED module according to claim 13, wherein the first conductive electrode of the first LED chip is connected to the 1-1$^{st}$ electrode pattern; the first conductive electrode of the second LED chip is connected to the 1-3$^{rd}$ electrode pattern; and the second conductive electrode of the first LED chip and the second conductive electrode of the second LED chip are connected to the 1-2$^{nd}$ electrode pattern.

16. The side view LED module according to claim 13, wherein the concave electrodes comprise a first concave electrode connected to the 2-1$^{st}$ electrode pattern and a second concave electrode connected to the 2-3$^{rd}$ electrode pattern.

17. A side view LED package comprising:
an LED unit; and
a body comprising:

a first side on which the LED unit is mounted, the first side comprising a first first electrode pattern and a second first electrode pattern;

a second side parallel to the first side and comprising a first second electrode pattern and a second second electrode pattern;

a third side orthogonal to the first and second sides and comprising a first edge and a second edge opposite to the first edge;

a first via hole formed along the first edge;

a second via hole formed along the second edge;

a first via comprising a conductive material filled in the first via hole to connect the first first electrode pattern to the first second electrode pattern; and a second via comprising a conductive material filled in the second via hole to connect the second first electrode pattern to the second second electrode pattern.

18. The side view LED package according to claim 17, wherein the first and second vias are exposed to the outside of the body.

19. The side view LED package according to claim 17, wherein each of the first first electrode pattern and the first second electrode pattern has an L shape with a horizontal portion and a vertical portion.

20. The side view LED package according to claim 19, wherein the vertical portion of the first first electrode pattern, the first via, and the vertical portion of the second first electrode pattern forms an angled C-shaped soldering pattern.

21. The side view LED package according to claim 17, wherein the side view LED package is mounted on a mount substrate such that third side faces the mount substrate.

22. The side view LED package according to claim 17, wherein the LED unit is of a chip scale package (CSP) type.

23. The side view LED package according to claim 17, wherein the LED unit comprises an LED chip, an inwardly-obliquely cut wavelength converting sheet attached to the LED chip, and a reflector structure surrounding side surfaces of the LED chip and side surfaces of the wavelength converting sheet.

24. The side view LED package according to claim 23, wherein an area of a side of the wavelength converting sheet in contact with the LED chip is equal to or larger than a contact area between the LED chip and the wavelength converting sheet.

25. The side view LED package according to claim 23, wherein a cross-sectional area of the wavelength converting sheet increases gradually from a side in contact with the LED chip to an opposite side.

26. The side view LED package according to claim 17, wherein the LED unit is not in contact with the second side of the body.

27. The side view LED package according to claim 17, wherein the LED unit is connected to both the first first electrode pattern and the second first electrode pattern on the first side, and the first first electrode pattern and the second first electrode pattern are not electrically connected to one another.

* * * * *